United States Patent
Fuse et al.

(10) Patent No.: US 7,394,415 B2
(45) Date of Patent: Jul. 1, 2008

(54) TIME-INTERLEAVED ANALOG-TO-DIGITAL CONVERTER AND HIGH SPEED SIGNAL PROCESSING SYSTEM USING THE SAME

(75) Inventors: Masaaki Fuse, Atsugi (JP); Hitoshi Sekiya, Atsugi (JP)

(73) Assignee: Anritsu Corporation, Atsugi-shi (JP)

( * ) Notice: Subject to any disclaimer, the term of this patent is extended or adjusted under 35 U.S.C. 154(b) by 0 days.

(21) Appl. No.: 10/590,752

(22) PCT Filed: Dec. 22, 2005

(86) PCT No.: PCT/JP2005/023676
§ 371 (c)(1),
(2), (4) Date: Aug. 25, 2006

(87) PCT Pub. No.: WO2006/075505
PCT Pub. Date: Jul. 20, 2006

(65) Prior Publication Data
US 2007/0171116 A1    Jul. 26, 2007

(30) Foreign Application Priority Data
Jan. 11, 2005    (JP) ............................. 2005-004455

(51) Int. Cl.
*H03M 1/10* (2006.01)
(52) U.S. Cl. ...................................... 341/120; 341/155
(58) Field of Classification Search ................ 341/120, 341/141, 155
See application file for complete search history.

(56) References Cited

U.S. PATENT DOCUMENTS 4,763,105 A * 8/1988 Jenq ........................... 341/120
5,294,926 A * 3/1994 Corcoran ..................... 341/120
6,081,215 A * 6/2000 Kost et al. ................... 341/120

(Continued)

FOREIGN PATENT DOCUMENTS

JP    06-152410 A    5/1994

(Continued)

OTHER PUBLICATIONS

Notification Concerning Transmittal of International Preliminary Report on Patentability, Chapter I of the Patent Cooperation Treaty, and Written Opinion of the International Searching Authority, for PCT/JP2005/023676, dated Jul. 26, 2007. 5 sheets.

*Primary Examiner*—Howard Williams
(74) *Attorney, Agent, or Firm*—Frishauf, Holtz, Goodman & Chick, P.C.

(57) ABSTRACT

A time-interleaved analog-to-digital converter stores in a correction information memory, correction information required to correct an error between signals output by a plurality of N analog-to-digital converters in advance. At this time, in order to enable acquisition of data required for a correction processing within a short period of time, a signal generator causes the plurality of N analog-to-digital converter to input a calibration signal including a plurality of signal components, each of which is positioned at a desired frequency in a bandwidth in which N/2 times of a sampling frequency Fs is defined as an upper limit, the signal components appearing in a bandwidth in which half times of the sampling clock frequency Fs is defined as an upper limit by sampling the analog-to-digital converters. A correction information calculating unit carries out a spectrum analysis relevant to analog-to-digital converted signals output by the plurality of N analog-to-digital converters in response to the calibration signal, thereby obtaining an amplitude and a phase of a plurality of signal components, newly obtaining the correction information, based on the amplitude and phase, and updating contents of the correction information memory in accordance with newly obtained correction information.

21 Claims, 25 Drawing Sheets

U.S. PATENT DOCUMENTS

| | | | |
|---|---|---|---|
| 6,269,317 B1 * | 7/2001 | Schachner et al. | 702/91 |
| 2003/0080885 A1 * | 5/2003 | Tamba | 341/120 |
| 2004/0032385 A1 | 2/2004 | Park et al. | |
| 2004/0174284 A1 | 9/2004 | Pupalaikis | |
| 2006/0250288 A1 * | 11/2006 | Fernandez et al. | 341/120 |

FOREIGN PATENT DOCUMENTS

| | | |
|---|---|---|
| JP | 2002-246910 A | 8/2002 |
| JP | 2004-328436 A | 11/2004 |
| JP | 2004328436 A * | 11/2004 |

\* cited by examiner

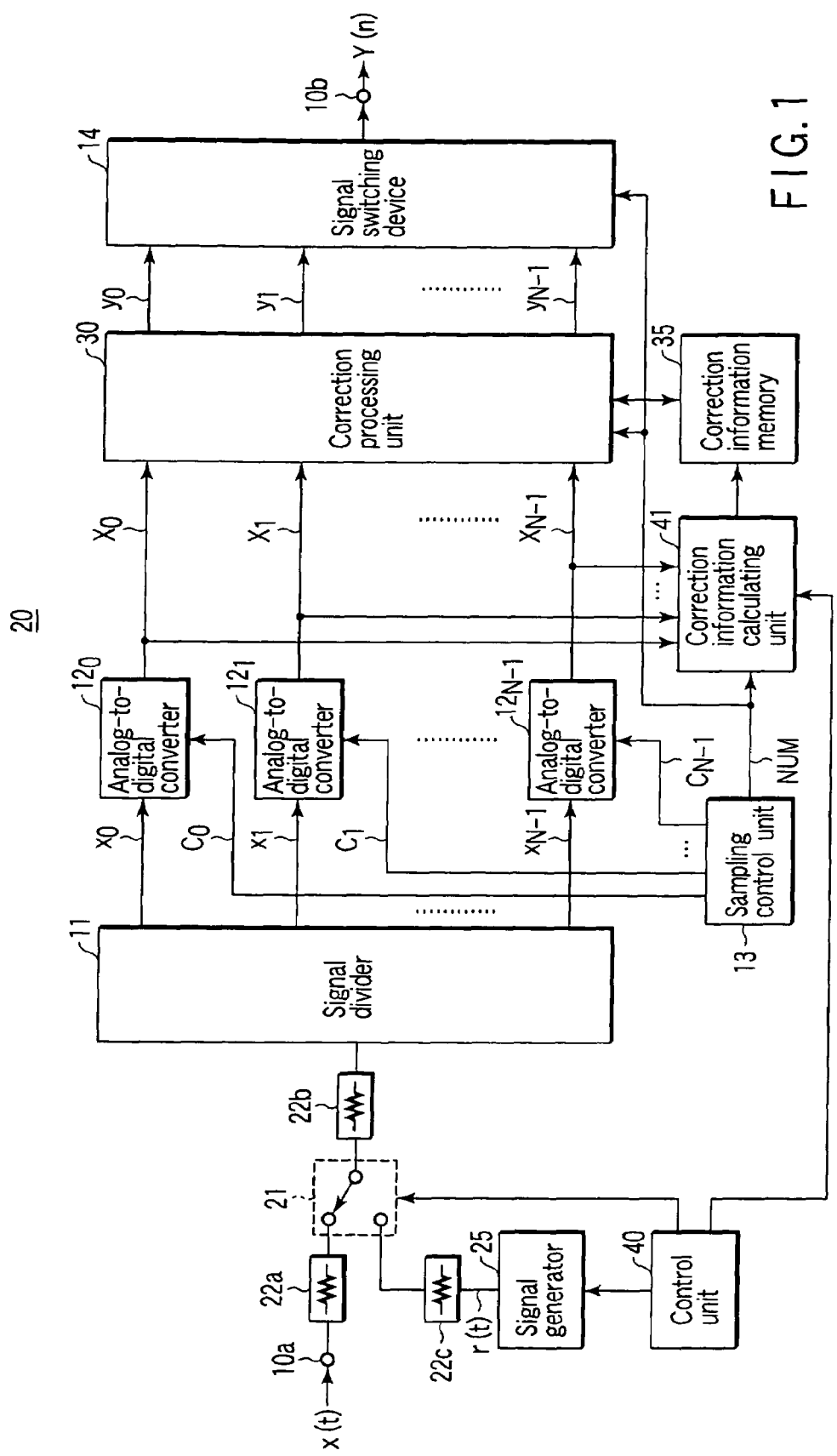
F I G. 1

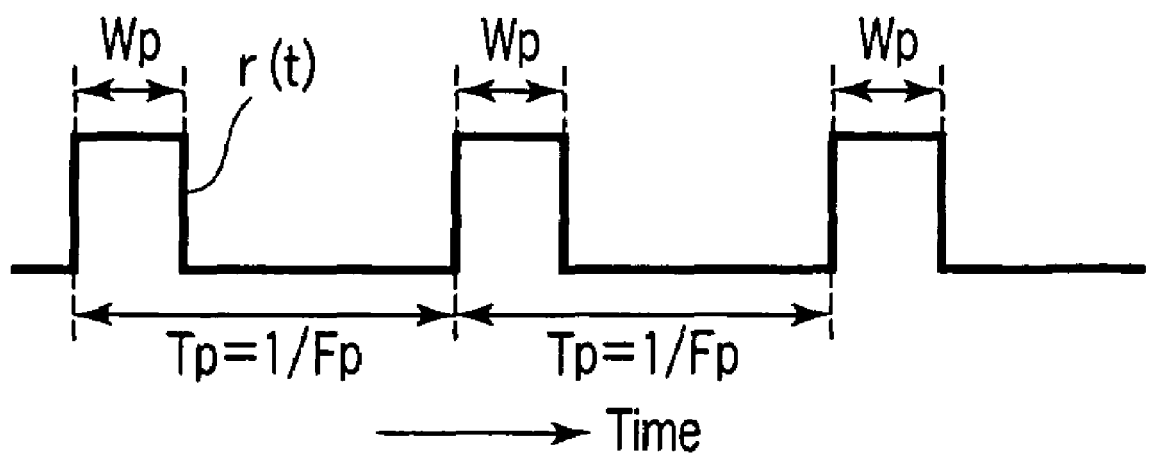
F I G. 5A

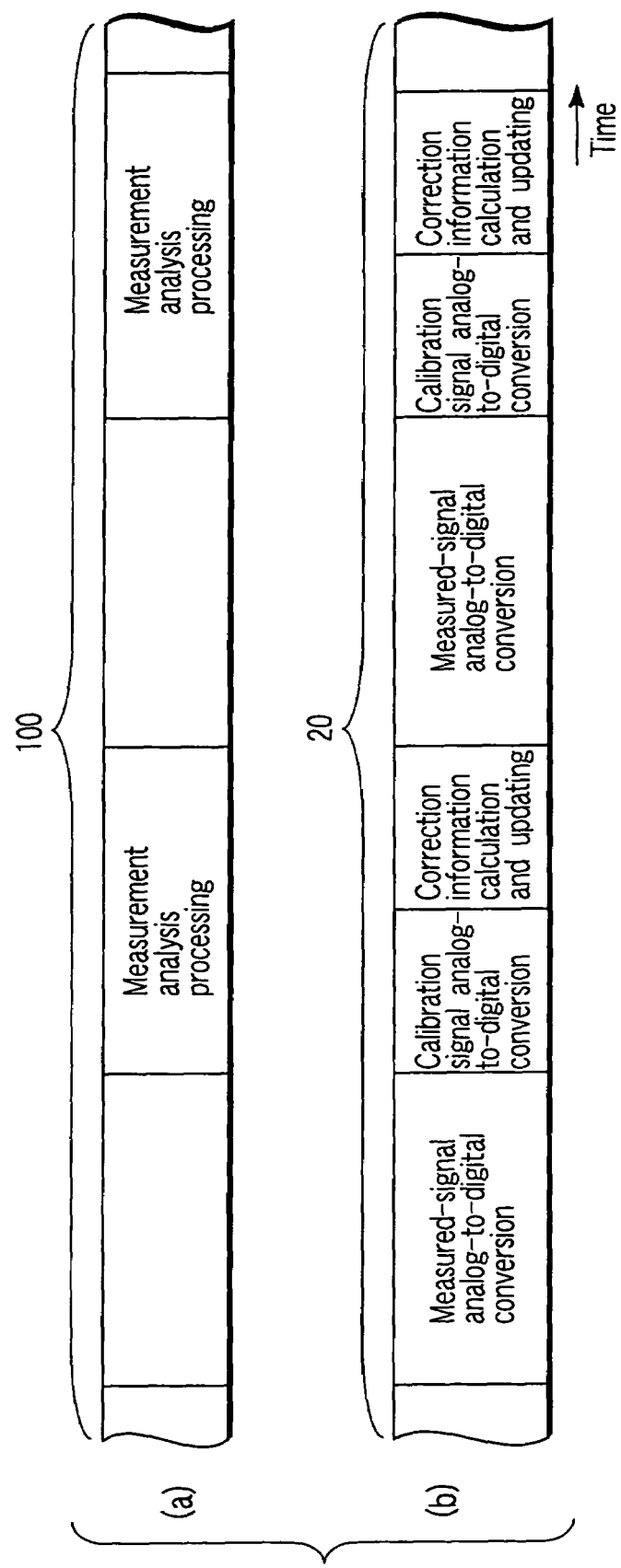
F I G. 10B

| i \ j | -1 | 0 | 1 |
|---|---|---|---|
| 0 | $h_{0,-1}$ | $h_{0,0}$ | $h_{0,1}$ |
| 1 | $h_{1,-1}$ | $h_{1,0}$ | $h_{1,1}$ |
| 2 | $h_{2,-1}$ | $h_{2,0}$ | $h_{2,1}$ |
| ⋮ | ⋮ | ⋮ | ⋮ |
| N-1 | $h_{N-1,-1}$ | $h_{N-1,0}$ | $h_{N-1,1}$ |

FIG. 13

| i \ j | M1 | ⋯ | -1 | 0 | 1 | ⋯ | M2 |
|---|---|---|---|---|---|---|---|
| 0 | $g_{0,M1}$ | ⋯ | $g_{0,-1}$ | $g_{0,0}$ | $g_{0,1}$ | ⋯ | $g_{0,M2}$ |
| 1 | $g_{1,M1}$ | ⋯ | $g_{1,-1}$ | $g_{1,0}$ | $g_{1,1}$ | ⋯ | $g_{1,M2}$ |
| 2 | $g_{2,M1}$ | ⋯ | $g_{2,-1}$ | $g_{2,0}$ | $g_{2,1}$ | ⋯ | $g_{2,M2}$ |
| ⋮ | ⋮ | ⋮ | ⋮ | ⋮ | ⋮ | ⋮ | ⋮ |
| N-1 | $g_{N-1,M1}$ | ⋯ | $g_{N-1,-1}$ | $g_{N-1,0}$ | $g_{N-1,1}$ | ⋯ | $g_{N-1,M2}$ |

FIG. 14

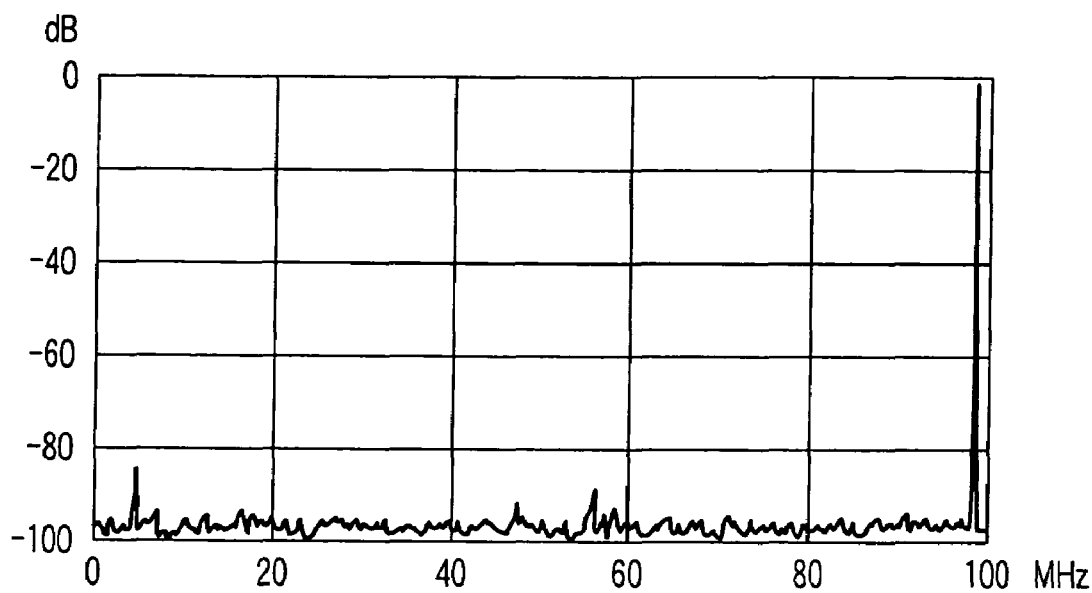
F I G. 19A

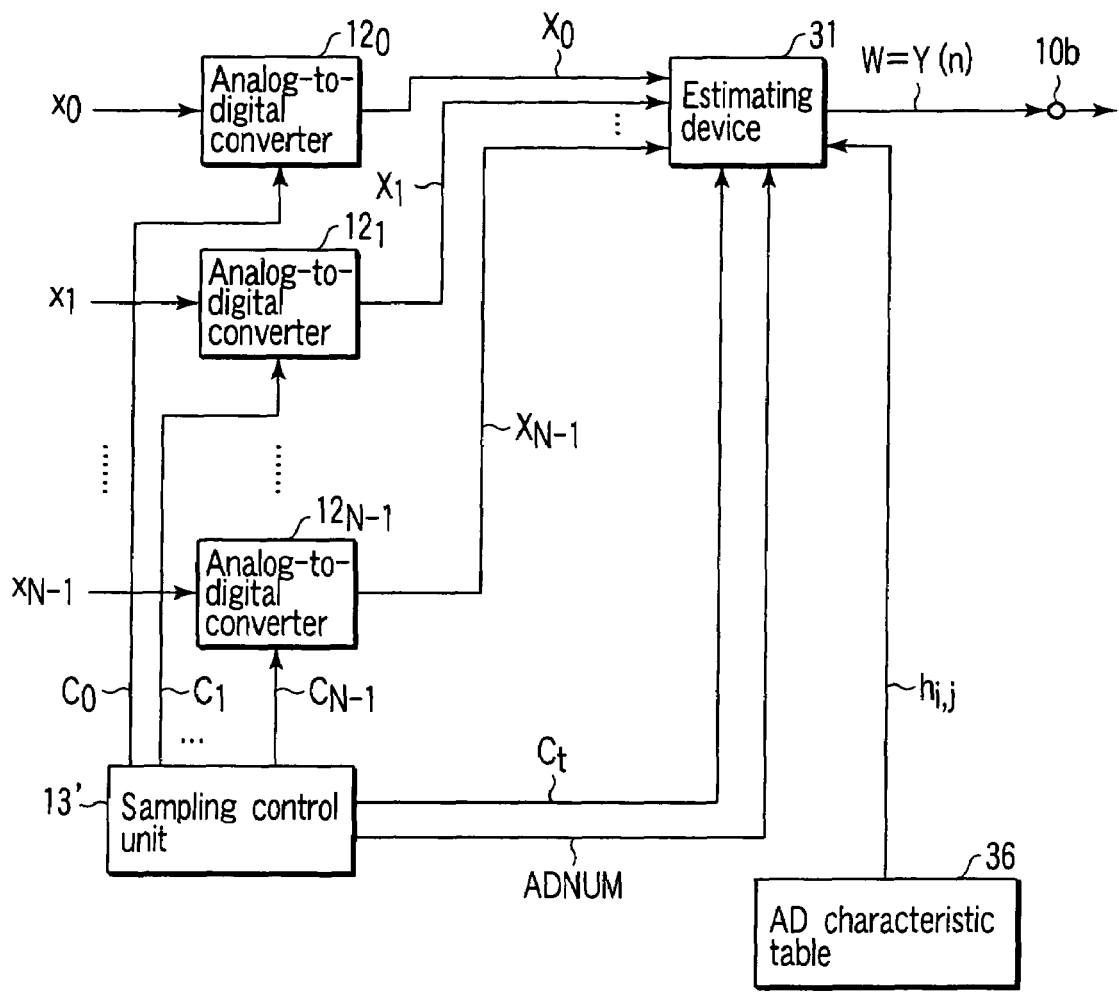
F I G. 20

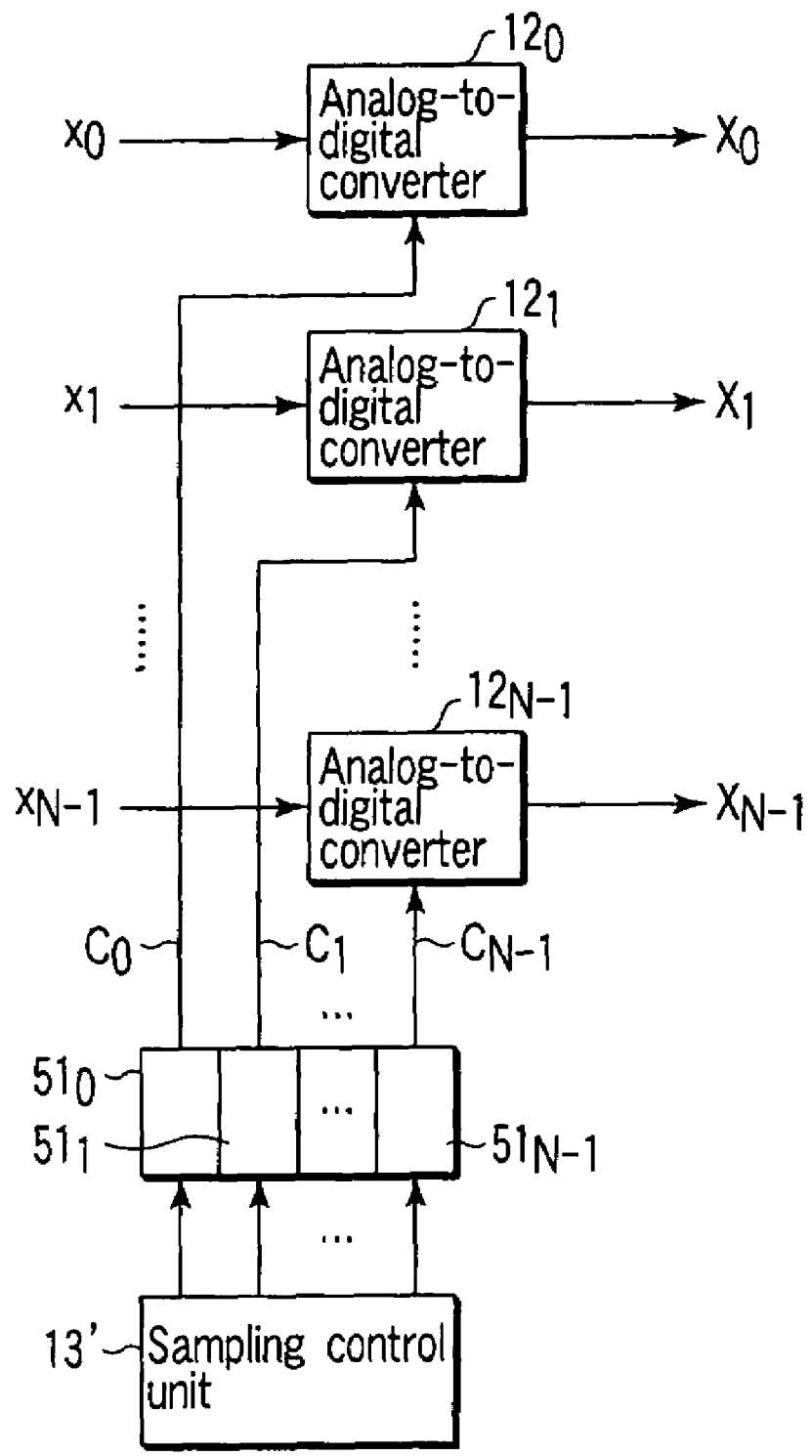
F I G. 21

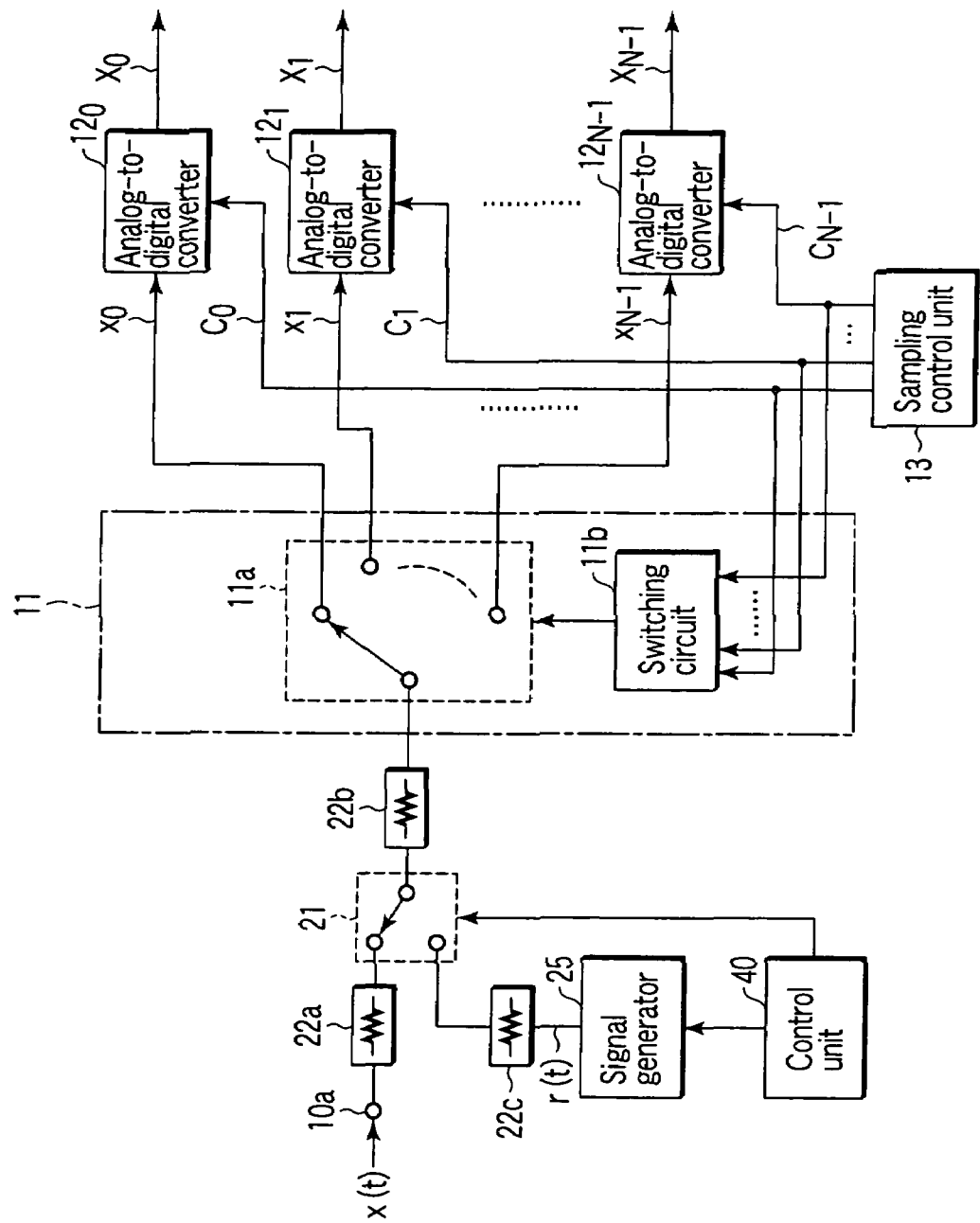
F I G. 22

TIME-INTERLEAVED ANALOG-TO-DIGITAL CONVERTER AND HIGH SPEED SIGNAL PROCESSING SYSTEM USING THE SAME

This application is a U.S. National Phase Application under 35 USC 371 of International Application PCT/JP2005/023676 filed Dec. 22, 2005.

TECHNICAL FIELD

The present invention relates to an improved time-interleaved analog-to-digital converter and a signal processing system using the same. More particularly, the present invention relates to a high speed processing compatible analog-to-digital converter employing a technique for enabling acquisition of information required for calibration within a short period of time in the time-interleaved analog-to-digital converter, and a high speed signal processing system using the same.

BACKGROUND ART

Recently, as one of the high speed signal processing systems, there has been discussed the achievement of a spectrum analyzer or the like capable of sampling a broadband analog signal to convert the sampled signal into a digital signal sequence, and carrying out a variety of signal processings such as spectrum analyzing at a high speed.

In such a high speed signal processing system, the mere use of an exiting analog-to-digital converter limits high speed processing responsiveness.

Therefore, it is thought to employ a time-interleaved analog-to-digital converter enabling high speed processing equivalently by carrying out analog-to-digital conversion in accordance with a time interleave scheme using a plurality of the existing analog-to-digital converter.

FIG. 23 is a block diagram depicting a basic configuration of a time-interleaved analog-to-digital converter 10 which has been conventionally known.

FIG. 24 is a timing chart showing an operation of the time-interleaved analog-to-digital converter 10 shown in FIG. 23 for the purpose of explanation.

That is, in this conventional time-interleaved analog-to-digital converter 10, an analog input signal x(t) as shown in FIG. 24 (a) is input to an input terminal 10a.

This analog input signal x(t) is branched to a plurality of N signal paths by a signal divider 11, and then, the respective branched signals are input correspondingly to N analog-to-digital converters $12_0$ to $12_{N-1}$ controlled by a sampling control unit 13 described later, whereby the input signals are converted into a plurality of digital signal sequences $X_0$ to $X_{N-1}$.

The plurality of digital signal sequences $X_0$ to $X_{N-1}$ each are input to a signal switching device 14 controlled by the sampling control unit 13 described later.

Here, each sampling control unit 13 has N clocks $C_0$ to $C_{N-1}$ as shown in (b1) to (bN) shown in FIG. 24, the clocks being internally generated, i.e., N sampling clocks $C_0$ to $C_{N-1}$ which have a cycle Ts and whose phase has been shifted by Ts/N are supplied to N analog-to-digital converters $12_0$ to $12_{N-1}$, respectively correspondingly.

In addition, the sampling control unit 13 assigns to the signal switching device 14 a specifying signal ADNUM (0 to N-1) for specifying the analog-to-digital converter that carries out sampling from among the analog-to-digital converters $12_0$ to $12_{N-1}$, as shown in FIG. 24(d), the converters being internally generated.

This specifying signal ADNUM (0 to N-1) is provided as a switching signal for sequentially selectively switching a plurality of digital signal sequences $X_0$ to $X_{N-1}$ in the signal switching device 14, and outputting the switched signal trains to an output terminal 10b.

Then, analog-to-digital converters $12_0$ to $12_{N-1}$ sample input values x(P), x(P+1), x(P+2), . . . of an analog input signal x(t) at a timing at which each of clocks $C_0$ to $C_{N-1}$ has been received from the sampling control unit 13, and converts the sampled data to digital data $X_{0,P}, X_{1,P+1}, X_{2,P+2}, \ldots$ as shown in (c1) to (cN) of FIG. 24.

Each of these sampled data $X_{0,P}, X_{1,P+1}, X_{2,P+2}, \ldots$ are output to the signal switching device 14.

The signal switching device 14 sequentially selects the sampled data $X_{0,P}, X_{1,P+1}, X_{2,P+2}, \ldots$ output from the analog-to-digital converter $12_0$ to $12_{N-1}$ specified by the specifying signal ADNUM from the sampling control unit 13 from among the analog-to-digital converters $12_0$ to $12_{N-1}$, and outputs to an output terminal 10b a digital signal sequence Y(n) in which the sampled data are arranged sequentially in order of sampling as shown in FIG. 24(e).

The thus obtained digital signal sequence Y(n) becomes equivalent to that obtained by sampling an input signal x(t) in a cycle Ts' that is 1/N of a clock cycle Ts.

Therefore, this time-interleaved analog-to-digital converter 10 can carry out high speed sampling while using low speed analog-to-digital converters $12_0$ to $12_{N-1}$.

However, in the above-described conventional time-interleaved analog-to-digital converter 10, there is a problem that an error occurs with a result of signal processing of the obtained sample values by a signal processing system.

This problem is caused by the fact that an error occurs with outputs of the analog-to-digital converters $12_0$ to $12_{N-1}$ as a result of a difference in distribution characteristics of the signal divider 12 itself or frequency characteristics of a distribution path and a difference in frequency characteristics of the analog-to-digital converters $12_0$ to $12_{N-1}$ when the input signal x(t) is input to be divided to the plurality of analog-to-digital converters $12_0$ to $12_{N-1}$.

Therefore, in the case where the signal processing system requires high analog-to-digital conversion precision, there is a need for correcting each of the above-described errors in the above-described conventional time-interleaved analog-to-digital converter 10.

For this calibration, a correction processing may be made by obtaining correction information while a calibration signal is input to the above-described time-interleaved analog-to-digital converter 10.

Specifically, in a state in which the calibration signal has been input, the output data is obtained from each analog-to-digital converter, and the obtained data or a processing result relevant to the data is compared, thereby obtaining correction information required to equalize conversion characteristics of each analog-to-digital converter including an input path in advance.

Then, in a state in which a signal targeted for analog-to-digital conversion has been input to the above-described conventional time-interleaved analog-to-digital converter 10, a correction processing is made based on the correction information with respect to an output of each analog-to-digital converter.

In order to carry out such a correction processing, for example, a technique of obtaining information required for calibration is disclosed in patent document 1.

That is, this technique is configured to select by a switch either of a sine wave signal output from a signal generator incorporated in the above-described conventional time-interleaved analog-to-digital converter or an analog signal input from an input terminal and targeted for conversion, so as to enable input to a plurality of analog-to-digital converters.

In addition, in this technique, at the time of calibration, an output signal of a signal generator is input to a plurality of analog-to-digital converters, and information required for calibration is obtained from its output data.

Patent document 1: Jpn. Pat. Appln. KOKAI Publication No. 6-152410

DISCLOSURE OF INVENTION

However, as in patent document 1 described above, in the case where the characteristics of each analog-to-digital converter is checked using a sine wave signal (namely, a signal of a single frequency) as a calibration signal, the frequencies of calibration signals are sequentially changed, data is obtained every time of such change, and information required for calibration must be obtained from these items of output data.

Therefore, in the technique disclosed in patent document 1 described above, there is a problem that a processing of converting an analog signal targeted for conversion into a digital signal cannot be made while information required for such calibration is obtained.

In particular, in a signal processing system that periodically carries out a signal monitoring processing by using a time-interleaved analog-to-digital converter, there is a need for frequently carrying out a correction processing in the case where the system is easily affected by an environmental change. Therefore, stopping an essential monitoring processing for a long period of time every time such correction processing is made becomes extremely disadvantageous.

The present invention has been made to solve the above-described problem in the prior art. It is an object of the present invention to provide an time-interleaved analog-to-digital converter and a high speed signal processing system using the same that have been improved so as to enable acquisition of data required for calibration within a short period of time.

In order to achieve the above object, according to a first aspect of the present invention, there is provided a time-interleaved analog-to-digital converter comprising:

an input terminal (10a) to input a to-be-measured signal x(t);

a signal generator (25) which generates a calibration signal r(t);

a plurality of N analog-to-digital converters (12);

a switch (21) which selects either of the to-be-measured signal input from the input terminal and the calibration signal output from the signal generator;

a signal divider (11) which divides the signal selected by the switch into a plurality of N components, and causes the plurality of N analog-to-digital converters to input the divided signal components, respectively;

a sampling control unit (13, 13') which assigns sampling clocks whose cycle is Ts and whose phase is shifted by Ts/N, respectively, to the plurality of N analog-to-digital converters;

a correction information memory (35) which stores correction information required to correct an error between signals output by the plurality of N analog-to-digital converters, the error occurring when a difference exists in at least one of a frequency characteristic of an amplitude and a frequency characteristic of a phase from input to the input terminal to a conversion processing in the plurality of N analog-to-digital converters;

a correction processing unit (30) which carries out a correction processing in accordance with the correction information stored in the correction information memory in response to signals output by the plurality of N analog-to-digital converters to receive the to-be-measured signal; and a correction information calculating unit (41) which calculates an amplitude and a phase of the plurality of signal components by carrying out a spectrum analysis with respect to signals output by the plurality of N analog-to-digital converters to receive the predetermined calibration signal output from the signal generator, newly obtains the correction information based on a result of the calculation, and updates contents of the correction information memory in accordance with newly obtained correction information, wherein the signal generator is configured to output the calibration signal that includes a plurality of signal components positioned, respectively, at desired frequencies in a bandwidth in which N/2 times of a frequency Fs of the sampling clock assigned to each of the plurality of analog-to-digital converters is defined as an upper limit, the plurality of signal components appearing at frequencies different from each other in a bandwidth in which half of the frequency Fs of the sampling clock is defined as an upper limit by sampling of each of the analog-to-digital converters.

In order achieve the above object, according to a second aspect of the present invention, there is provided the time-interleaved analog-to-digital converter according to the first aspect, wherein the signal generator outputs as the calibration signal a pulse signal of which the plurality of signal components in the bandwidth in which N/2 times of the frequency Fs of the sampling clock is defined as an upper limit is composed of a basic wave component and a high harmonic wave component of up to a predetermined order, the pulse signal having a power ratio between overlapped components of a predetermined value or smaller, in the case where a high harmonic wave component that is higher in order than the predetermined order from high harmonic wave components of the pulse signal and the plurality of signal components overlap in a same frequency in the bandwidth in which half of the frequency Fs of the sampling clock is defined as an upper limit by sampling of each of the analog-to-digital converters.

In order to achieve the above object, according to a third aspect of the present invention, there is provided the time-interleaved analog-to-digital converter according to the first aspect, wherein the signal generator is composed of: a plurality of sine wave generators (26) which generate sine wave signals in the bandwidth in which N/2 times of the frequency Fs of the sample clock is defined as an upper limit, the sine wave signals having different frequencies from each other; and an additive combiner (27) which additively combines output signals of the plurality of sine wave generators with each other.

In order to achieve the above object, according to a fourth aspect of the present invention, there is provided the time-interleaved analog-to-digital converter according to the first aspect, wherein the correction information calculating unit uses one of the plurality of N analog-to-digital converters as a reference analog-to-digital converter based on the amplitude and phase of the plurality of signal components obtained by the spectrum analysis, and is configured to calculate as the correction information a coefficient of a filter having an impulse response that meets a characteristic of a difference between a frequency characteristic from the input terminal to each of output terminals of the plurality of N analog-to-digital converters and a frequency characteristic of the reference analog-to-digital converter, and to store the calculated coefficient in an AD characteristic table (36) in the correction information memory, and the correction processing unit includes an estimating device (31) which estimates a sample value obtained assuming that another analog-to-digital converter has made a conversion processing at a timing of updating a sample value by an analog-to-digital converter having received the sampling clock based on each of the sample values output from the plurality of N analog-to-digital converters in response to the to-be-measured signal and the coefficient stored in the AD characteristic table.

In order to achieve the above object, according to a fifth aspect of the present invention, there is provided the time-interleaved analog-to-digital converter according to the fourth aspect, wherein the correction information calculating unit is configured to calculate as the correction information a coefficient of a filter having an impulse response that meets a frequency characteristic of offsetting a difference between a frequency characteristic of the reference analog-to-digital converter and a frequency characteristic of the remainders of the plurality of N analog-to-digital converters, respectively, based on the amplitude and phase of the plurality of signal components obtained by the spectrum analysis, and to store the calculated coefficient in an equalizer coefficient table (37) in the correction information memory, and the correction processing unit includes a plurality of estimating devices ($31_0$-$31_{N-1}$), each of which is provided as the estimating device at each of the analog-to-digital converters; and a plurality of equalizers (32), each of which carries out filtering based on the coefficient stored in the equalizer coefficient table with respect to each of the digital data output by the plurality of estimating devices, and outputs an error-corrected digital data.

In order to achieve the above object, according to a sixth aspect of the present invention, there is provided the time-interleaved analog-to-digital converter according to the first aspect, further comprising a plurality of attenuators (22a-22c) interposed at least any one of between the input terminal and the switch, between the signal generator and the switch, and between the signal divider and the switch.

In order to achieve the above object, according to a seventh aspect of the present invention, there is provided the time-interleaved analog-to-digital converter according to the sixth aspect, further comprising: a second switch (23) interlocked with the switch; and a terminator (24) connected to the second switch, wherein the time-interleaved analog-to-digital converter is configured to, when the calibration signal is selected by the switch, close the second switch and enable the terminator to terminate the to-be-measured signal input from the input terminal.

In order to achieve the above object, according to an eighth aspect of the present invention, there is provided the time-interleaved analog-to-digital converter according to the first aspect, further comprising signal combining means (14, 10b) configured to combine output signals, which are output by the plurality of N analog-to-digital converters to receive the to-be-measured signal through sampling based on the sampling clock, in digital signal sequences (Y(n)) arranged in order of sampling, and to output combined output signals.

In order to achieve the above object, according to a ninth aspect of the present invention, there is provided the time-interleaved analog-to-digital converter according to the eighth aspect, further comprising, as the signal combining means:

an output terminal (10b) to output the digital signal sequence; and a signal switching device (14) which sequentially selectively switches output signals that are output the plurality of N analog-to-digital converters to receive the to-be-measured signal through sampling based on the sampling clock, respectively, and which outputs the output signal to the output terminal, wherein, in order to sequentially selectively switch and output the output signals, that are output by the plurality of N analog-to-digital converters, by means of the signal switching device, the sampling control unit assigns to the signal switching device a specifying signal that specifies an analog-to-digital converter having carried out sampling from among the plurality of N analog-to-digital converters, thereby making it possible to combine signals in digital signal sequences (Y(n)) arranged from the signal switching device in order of sampling, and to output combined output signals to the output terminal.

In order to achieve the above object, according to a tenth aspect of the present invention, there is provided the time-interleaved analog-to-digital converter according to the first aspect, further comprising: a control unit (40) to connect the switch to the signal generator side and input the calibration signal to the signal divider in response to a calibration processing request in accordance with an external instruction or a predetermined time schedule.

In order to achieve the above object, according to an eleventh aspect of the present invention, there is provided a signal processing system comprising:

a time-interleaved analog-to-digital converter (20);

a signal processing device (100) which executes a predetermined signal processing in response to an analog-to-digital converted output signal from the time-interleaved analog-to-digital converter, the time-interleaved analog-to-digital converter comprising:

an input terminal (10a) to input a to-be-measured signal x(t);

a signal generator (25) which generates a calibration signal r(t);

a plurality of N analog-to-digital converters (12);

a switch (21) which selects either of the to-be-measured signal input from the input terminal and the calibration signal output from the signal generator;

a signal divider (11) which divides a signal selected by the switch into a plurality of N components, and causes the plurality of N analog-to-digital converters to input the divided signal components, respectively;

a sampling control unit (13, 13') which assigns sampling clocks whose cycle is Ts and whose phase is shifted by Ts/N, respectively, to the plurality of N analog-to-digital converters;

a correction information memory (35) which stores correction information required to correct an error between signals output by the plurality of N analog-to-digital converters, the error occurring when a difference exists in at least one of a frequency characteristic of an amplitude and a frequency characteristic of a phase from input to the input terminal to a conversion processing in the plurality of N analog-to-digital converters;

a correction processing unit (30) which carries out a correction processing in accordance with the correction information stored in the correction information memory in response to signals output by the plurality of N analog-to-digital converters to receive the to-be-measured signal; and a correction information calculating unit (41) which calculates an amplitude and a phase of the plurality of signal components by carrying out a spectrum analysis with respect to signals output by the plurality of N analog-to-digital converters to receive the predetermined calibration signal output from the signal generator, newly obtains the correction information based on a result of calculation, and updates contents of the correction information memory in accordance with newly obtained correction information, wherein the signal generator is configured to output the calibration signal that includes a plurality of signal components positioned, respectively, at desired frequencies in a bandwidth in which N/2 times of a frequency Fs of the sampling clock assigned to each of the plurality of analog-to-digital converters is defined as an upper limit, the plurality of signal components appearing at frequencies different from each other in a bandwidth in which half of the frequency Fs of the sample clock is defined as an upper limit by sampling of each of the analog-to-digital converters.

In order to achieve the above object, according to a twelfth aspect of the present invention, there is provided the high speed signal processing system according to the eleventh aspect, wherein the signal generator of the time-interleaved analog-to-digital converter outputs as the calibration signal a pulse signal of which the plurality of signal components in the bandwidth in which N/2 times of the frequency Fs of the sampling clock is defined as an upper limit is composed of a basic wave component and a high harmonic wave component of up to a predetermined order, the pulse signal having a power ratio between overlapped frequencies a predetermined value or smaller in the case where a high harmonic wave component that is higher in order than the predetermined order from high harmonic wave components of the pulse signal and the plurality of signal components overlap in a same frequency in the bandwidth in which half of the frequency Fs of the sampling clock is defined as an upper limit by sampling of each of the analog-to-digital converters.

In order to achieve the above object, according to a thirteenth aspect of the present invention, there is provided the high speed signal processing system according to the eleventh aspect, wherein the signal generator of the time-interleaved analog-to-digital converter is composed of: a plurality of sine wave generators (26) which generate sine wave signals in the bandwidth in which N/2 times of the frequency Fs of the sample clock is defined as an upper limit and at different frequencies from each other; and an additive combiner (27) which additively combines output signals of the plurality of sine wave generators with each other.

In order to achieve the above object, according to a fourteenth aspect of the present invention, there is provided the high speed signal processing system according to the eleventh aspect, wherein the correction information calculating unit of the time interleave scheme analog-to-digital converter uses one of the plurality of N analog-to-digital converters as a reference analog-to-digital converter based on the amplitude and phase of the plurality of signal components obtained by the spectrum analysis, and is configured to calculate as the correction information a coefficient of a filter having an impulse response that meets a characteristic of a difference between a frequency characteristic from the input terminal to each of output terminals of the plurality of N analog-to-digital converters and a frequency characteristic of the reference analog-to-digital converter, and to store calculated coefficient in an AD characteristic table (36) in the correction information memory, and the correction processing unit of the time-interleaved analog-to-digital converter includes an estimating device (31) which estimates a sample value obtained assuming that another analog-to-digital converter has made a conversion processing at a timing of updating a sample value by an analog-to-digital converter having received the sampling clock based on each of the sample values output from a plurality of N analog-to-digital converters in response to the to-be-measured signal and the coefficient stored in the AD characteristic table.

In order to achieve the above object, according to a fifteenth aspect of the present invention, there is provided the high speed signal processing system according to the fourteenth aspect, wherein the correction information calculating unit of the time-interleaved analog-to-digital converter is configured to calculate as the correction information a coefficient of a filter having an impulse response that meets a frequency characteristic of offsetting a difference between a frequency characteristic of the reference analog-to-digital converter and a frequency characteristic of the remainders of the plurality of N analog-to-digital converters, respectively, based on the amplitude and phase of the plurality of signal components obtained by the spectrum analysis, and to store calculated coefficient in an equalizer coefficient table (37) in the correction information memory, and the correction processing unit of the time-interleaved analog-to-digital converter includes: a plurality of estimating devices ($31_0$-$31_{N-1}$), each of which is provided as the estimating device at each of the analog-to-digital converters; and a plurality of equalizers (32), each of which carries out filtering based on the coefficient stored in the equalizer coefficient table with respect to each of sample values output by the plurality of estimating devices, and outputs an error-corrected sample value.

In order to achieve the above object, according to a sixteenth aspect of the present invention, there is provided the high speed signal processing system according to the eleventh aspect, wherein the time-interleaved analog-to-digital converter further comprises: a plurality of attenuators (22a-22c) interposed at least any one of between the input terminal and the switch, between the signal generator and the switch, and between the signal divider and the switch.

In order to achieve the above object, according to a seventeenth aspect of the present invention, there is provided the high speed signal processing system according to the sixteenth aspect, wherein the time-interleaved analog-to-digital converter further comprises: a second switch interlocked with the switch; and a terminator connected to the second switch, and the time-interleaved analog-to-digital converter is configured to, when the calibration signal is selected by the switch, close the second switch and enable the terminator to terminate the to-be-measured signal input from the input terminal.

In order to achieve the above object, according to an eighteenth aspect of the present invention, there is provided the high speed signal processing system according to the eleventh aspect, wherein the time-interleaved analog-to-digital converter further comprises signal combining means (14, 10b) configured to combine output signals, that are output by the plurality of N analog-to-digital converters to receive the to-be-measured signal through sampling based on the sampling clock, in digital signal sequences (Y(n)) arranged in order of sampling, and to output combined output signals.

In order to achieve the above object, according to a nineteenth aspect of the present invention, there is provided the high speed signal processing system according to the eighteenth aspect, wherein the signal combining means of the time-interleaved analog-to-digital converter further comprises: an output terminal (10b) to outputting the digital signal sequence; and a signal switching device (14) which sequentially selectively switches output signals, that are output by the plurality of N analog-to-digital converters to receive the to-be-measured signal through sampling based on the sampling clock, and which outputs each of the output signals to the output terminal, wherein, in order to sequentially selectively switch and output each of the output signals, that are output by the plurality of N analog-to-digital converters, by means of the signal switching device, the sampling control unit of the time-interleaved analog-to-digital converter assigns to the signal switching device a specifying signal that specifies an analog-to-digital converter having carried out sampling, from among the plurality of N analog-to-digital converters, thereby making it possible to combine signals in digital signal sequences (Y(n)) arranged from the output signal switching device in order of sampling, and to output combined output signals to the output terminal.

In order to achieve the above object, according to a twentieth aspect of the present invention, there is provided the high speed signal processing system according to the eleventh aspect, wherein the time-interleaved analog-to-digital converter further comprises: a control unit (40) to connect the switch to a side of the signal generator and input the calibration signal to the signal divider in response to a calibration processing request in accordance with an external instruction or a predetermined time schedule.

In order to achieve the above object, according to a twenty-first aspect of the present invention, there is provided the high speed signal processing system according to the eleventh aspect, wherein the signal processing device comprises:

a memory (101) which stores analog-to-digital converted output signal output from the time-interleaved analog-to-digital converter;

an analysis processing unit (102) which carries out a predetermined signal analysis processing with respect to the analog-to-digital converted output signal stored in the memory; and a system control unit which assigns a calibration processing request to the time-interleaved analog-to-digital converter during a period in which the signal processing device carries out the predetermined signal analysis processing, and causes the time-interleaved analog-to-digital converter to carry out analog-to-digital conversion for the calibration processing, followed by calculation and updating of the correction information and which sets the to-be-measured signal so as to be analog-to-digital convertible with respect to the time-interleaved analog-to-digital converter to receive the end of updating the correction information from the time-interleaved analog-to-digital converter.

The time-interleaved analog-to-digital converter according to the fourth aspect can be applied to the second and third aspects as well.

In addition, the time-interleaved analog-to-digital converter according to the eighth embodiment can be applied to the second to fifth aspects as well.

In addition, the high speed signal processing system according to the fourteenth aspect can be applied to the twelfth and thirteenth aspects as well.

In addition, the high speed signal processing system according to the eighteenth aspect can be applied to the twelfth to fifteenth aspects.

In the time-interleaved analog-to-digital converter according to the present invention configured as described above, a signal existing at predetermined frequency intervals in a bandwidth in which N/2 times of a sampling frequency Fs is defined as an upper limit, the signal including a plurality of signal components whose frequencies are different from each other when the signal has appears in a bandwidth in which half of the frequency Fs is defined as an upper limit by sampling the analog-to-digital converters, is input as a calibration signal; a spectrum analysis is made with respect to a signal that each analog-to-digital converter outputs with respect to the calibration signal; an amplitude and a phase of each of a plurality of signal components are obtained; and, based on the amplitude and phase, information required for a correction processing is obtained and updated.

Therefore, in the time-interleaved analog-to-digital converter according to the present embodiment, information required for calibration can be obtained within a short period of time as compared with a prior art of using a sin wave signal having a single frequency as a calibration signal, and a calibration processing can be made without stopping a conversion processing relevant to an input signal for a long period.

In addition, the high speed signal processing system using the time-interleaved analog-to-digital converter of the present invention configured as described above comprises a time-interleaved analog-to-digital converter 20 and a signal processing device 100 that executes a predetermined signal processing in response to an analog-to-digital converted output signal from this time-interleaved analog-to-digital converter 20.

Therefore, the high speed signal processing system using the time-interleaved analog-to-digital converter according to the present invention can obtain and update correction information required for correction by inputting a calibration signal for the time-interleaved analog-to-digital converter, while the signal processing device carries out an analysis processing. Further the time-interleaved analog-to-digital converter can always carry out an analog-to-digital conversion processing in response to a to-be-measured signal with high precision, thus, making it possible to ensure high speed processing capability of the high speed signal processing system.

BRIEF DESCRIPTION OF DRAWINGS

FIG. 1 is a block diagram depicting a configuration of a time-interleaved analog-to-digital converter according to a first embodiment of the present invention for the purpose of explanation.

FIG. 5A is a view showing a waveform and a spectrum of a calibration signal for use in the time-interleaved analog-to-digital converter shown in FIG. 1 for the purpose of explanation.

FIG. 10B is a diagram depicting a processing relationship between a signal processing device and a time-interleaved analog-to-digital converter of the high speed signal processing system shown in FIG. 10A for the purpose of explanation.

FIG. 13 is a view for explaining an AD characteristic table produced in a correction information memory for use in the time-interleaved analog-to-digital converter shown in FIG. 12.

FIG. 14 is a view for explaining an equalizer coefficient table produced in a correction information memory for use in the time-interleaved analog-to-digital converter shown in FIG. 12.

FIG. 19A is a characteristic view showing analog-to-digital conversion characteristics by the time-interleaved analog-to-digital converter shown in FIG. 1 for the purpose of explanation.

FIG. 20 is a block diagram depicting a configuration of essential portions of a time-interleaved analog-to-digital converter according to a second embodiment of the present invention for the purpose of explanation.

FIG. 21 is a block diagram depicting a configuration of essential portions of a time-interleaved analog-to-digital converter according to a third embodiment of the present invention for the purpose of explanation.

FIG. 22 is a block diagram depicting a configuration of essential portions of a time-interleaved analog-to-digital converter according to a fourth embodiment of the present invention for the purpose of explanation.

BEST MODE FOR CARRYING OUT THE INVENTION

Hereinafter, some embodiments of the present invention will be described with reference to the accompanying drawings.

First Embodiment

FIG. 1 is a block diagram depicting a configuration of a time-interleaved analog-to-digital converter according to a first embodiment of the present invention for the purpose of explanation.

Figure 23:
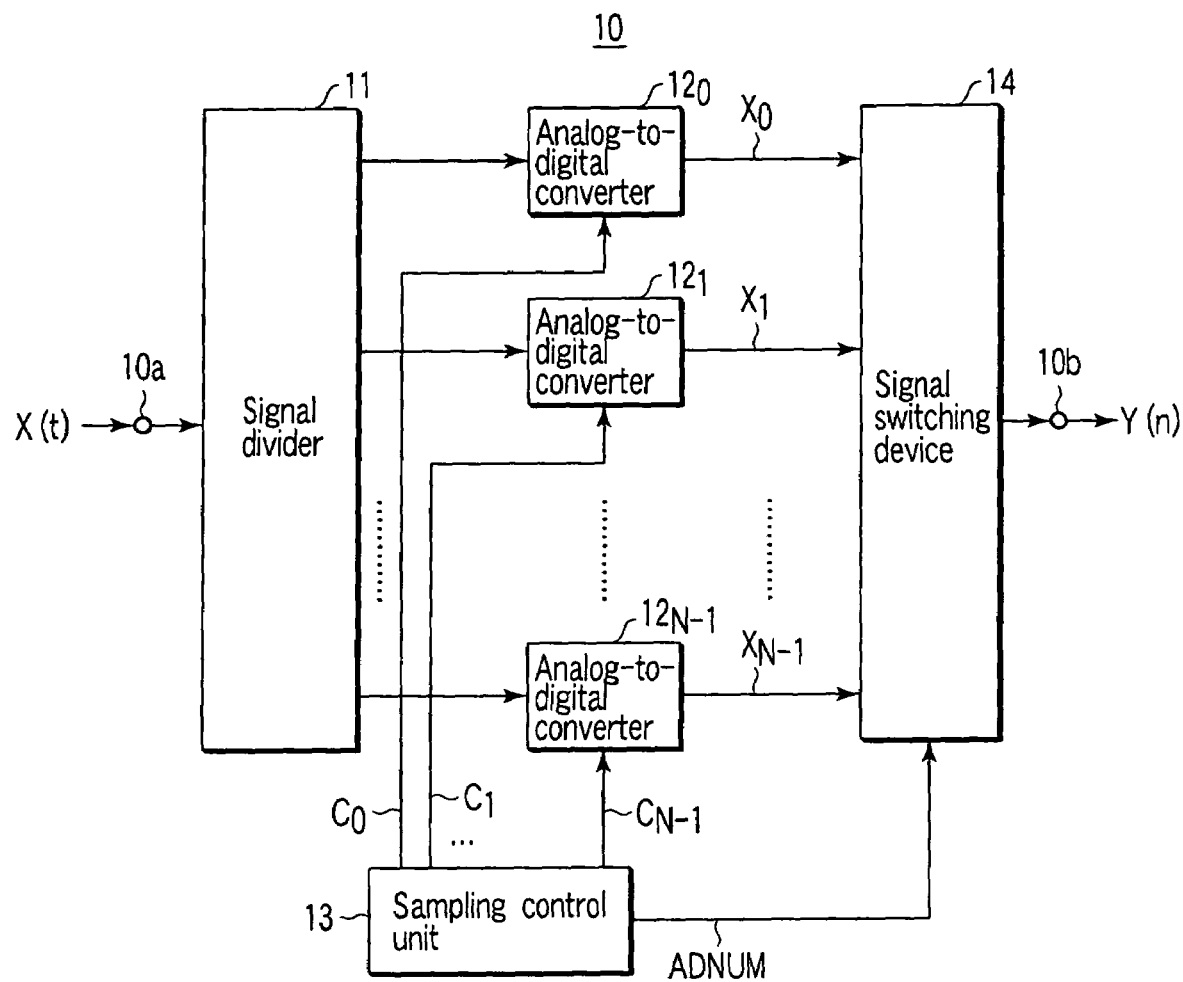
FIG. 23 is a block diagram depicting a configuration of a conventional time-interleaved analog-to-digital converter for the purpose of explanation.
Figure 24:
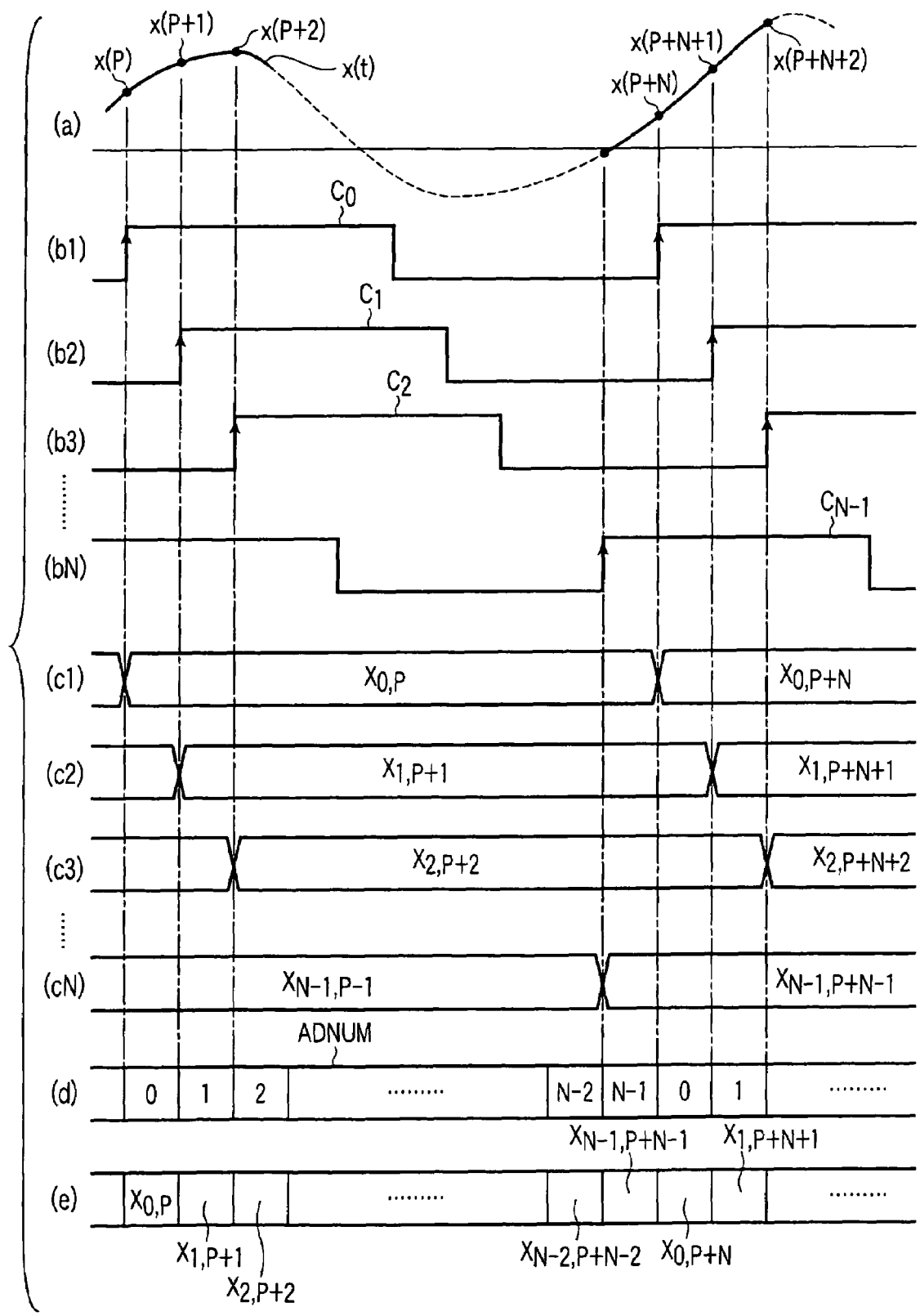
FIG. 24 is a timing chart depicting a operation of a conventional time-interleaved analog-to-digital converter for the purpose of explanation.

In FIG. 1, an input terminal $10a$, an output terminal $10b$, a signal divider 11, N analog-to-digital converters $12_0$ to $12_{N-1}$, a sampling control unit 13, and a signal switching device 14 are identical to an analog-to-digital converter 10 according to a basic configuration of a conventional time-interleaved analog-to-digital converter shown in FIG. 23 described previously. Thus, these constituent elements are designated by same reference numerals.

That is, the time-interleaved analog-to-digital converter according to the present invention basically has an input terminal $10a$ for inputting a to-be-measured signal x(t), a signal generator 25 that generates a calibration signal r(t), a plurality of N analog-to-digital converters 12, a switch 21 that selects either of the to-be-measured signal x(t) input from the input terminal $10a$ and the calibration signal r(t) output from the signal generator 25, a signal divider 11 that divides the signal selected by the switch 21 into a plurality of N components, thereby inputting the divided signal components to a plurality of N analog-to-digital converters 12, respectively, a sampling control unit 13 that assigns the sampling clocks having a cycle Ts and having a phase shifted by Ts/N, respectively, to the plurality of N analog-to-digital converter 12, a correction information memory 35 that stores correction information required to correct an error between signals output by the plurality of N analog-to-digital converters 12, the error occurring when a difference exists in at least one of the frequency characteristics of an amplitude and the frequency characteristics of a phase from the input to the input terminal $10a$ to the conversion processing by the plurality of N analog-to-digital converters 12, a correction processing unit that carries out a correction processing in accordance with the correction information stored in the correction information memory 35 in response to the signals output by the plurality of N analog-to-digital converters 12 to receive the to-be-measured signal x(t), and a correction information calculating unit 41 that calculates an amplitude and a phase of a plurality of signal components by carrying out a spectrum analysis with respect to the signals output by the plurality of N analog-to-digital converters 12 by receiving a predetermined calibration signal output from the signal generator 25, newly obtains correction information based on a result of the calculation, and updates the contents of the correction information memory 35 in accordance with the newly obtained correction information. The signal generator 25 is configured so as to output the calibration signal including a plurality of signal components positioned respectively at a desired frequency in a bandwidth in which N/2 times of a frequency Fs of sampling clocks assigned to the plurality of N analog-to-digital converters 12, respectively is defined as an upper limit, the plurality of signal components appearing at frequencies different from each other in a bandwidth in which half of the frequency Fs of the sampling clocks is defined as an upper limit by sampling of such each analog-to-digital converter 12.

Specifically, the to-be-measured signal x(t) of an analog input to the input terminal 10a is input to the signal divider 11 via one contact point of the switch 21 described later.

Branch signals $x_0(t)$ to $X_{N-1}(t)$ of the to-be-measured signal x(t) of the analog branched into a plurality of N signal paths by this signal divider 11 are input to a plurality of N analog-to-digital converters $12_0$ to $12_{N-1}$, respectively.

In addition, the sampling control unit 13 assigns N sampling clocks $C_0$ to $C_{N-1}$ whose phase has been shifted in a cycle Ts (frequency Fs) by Ts/N hours to N analog-to-digital converters $12_0$ to $12_{N-1}$, thereby causing each of the analog-to-digital converters $12_0$ to $12_{N-1}$ to carry out sampling synchronized with the sampling clocks.

The signal generator 25 that generates the calibration signal r(t) is connected to the other contact point of the switch 21.

By means of switching operation of this switch 21, either of the to-be-measured signal x(t) input from the input terminal 10a and the calibration signal r(t) output from the signal generator 25 is selected, and the selected signal is input to the signal divider 11.

Attenuators 22a, 22b, and 22c for restricting disturbance of impedance caused by the switch 21 are interposed between the input terminal 10a and the switch 21, between the signal generator 25 and the switch 21, and between the signal divider 11 and the switch 21, respectively.

The attenuation quantity of these attenuators 22a, 22b, and 22c is in order of some dB to some tens of dB, and is disadvantageous in attenuation a passed signal.

Hence, these attenuators 22a, 22b, and 22c contributes to greatly suppress a reflection component due to inconsistent switch 21 and stably and reproducibly carry out the analog-to-digital conversion processing by each of the analog-to-digital converters $12_0$ to $12_{N-1}$ in response to the to-be-measured signal x(t) and the calibration signal r(t), as described later.

Figure 2:
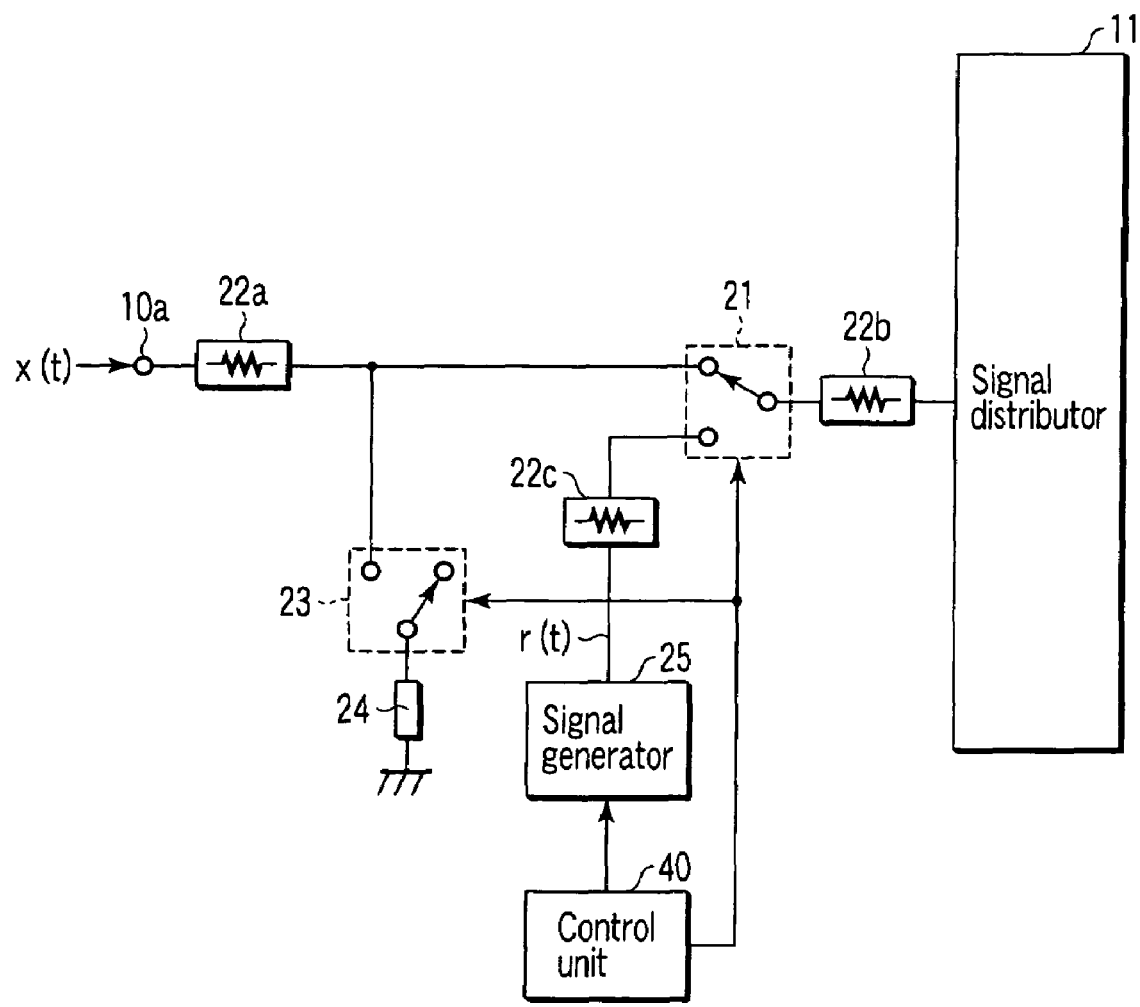
FIG. 2 is a block diagram depicting a configuration of a modified example of essential portions in the time-interleaved analog-to-digital converter shown in FIG. 1.

As shown in FIG. 2 as a modified example, by closing the switch 23 interlocked with the switch 21 so as to terminate the input signal x(t) by a terminator 24 at the time of inputting the calibration signal r(t), isolation relevant to the to-be-measured signal can be increased, and a further stable analog-to-digital conversion processing can be made.

The signal generator 25 generates a signal including a plurality of signal components whose frequencies are different from each other at the same time as a calibration signal.

More specifically, this signal generator 25 generates a sine wave composite signal obtained by combining a rectangular wave signal or a plurality of sine wave signals.

A condition required for a plurality of M frequency components included in the calibration signal from this signal generator 25 is that, in order to check an input frequency bandwidth of the whole analog-to-digital converter 20 in which N/2 times of the sampling frequency Fs is defined as an upper limit, it is necessary that these frequency components exist at intervals at which the frequency bandwidths are divided to be substantially equal to each other.

In addition, from among these frequency components, the frequency components exceeding the frequency Fs/2 is folded within a bandwidth in which the frequency Fs/2 is defined as Fs/2.

Hence, if the folded frequency coincides with a frequency of another component, analysis cannot be correctly carried out.

Therefore, another condition required for each of the frequency components included in a calibration signal is that frequencies are different from each other when they appears in a bandwidth in which the frequency Fs/2 is defined as an upper limit by the sampling at each of the analog-to-digital converters $12_0$ to $12_{N-1}$.

A group of the frequency components meeting such conditions exist infinitely.

Now, a description will be given with respect to a case of using a signal component whose frequency interval is constant in order to facilitate a configuration of the signal generator 25.

Figure 3A:
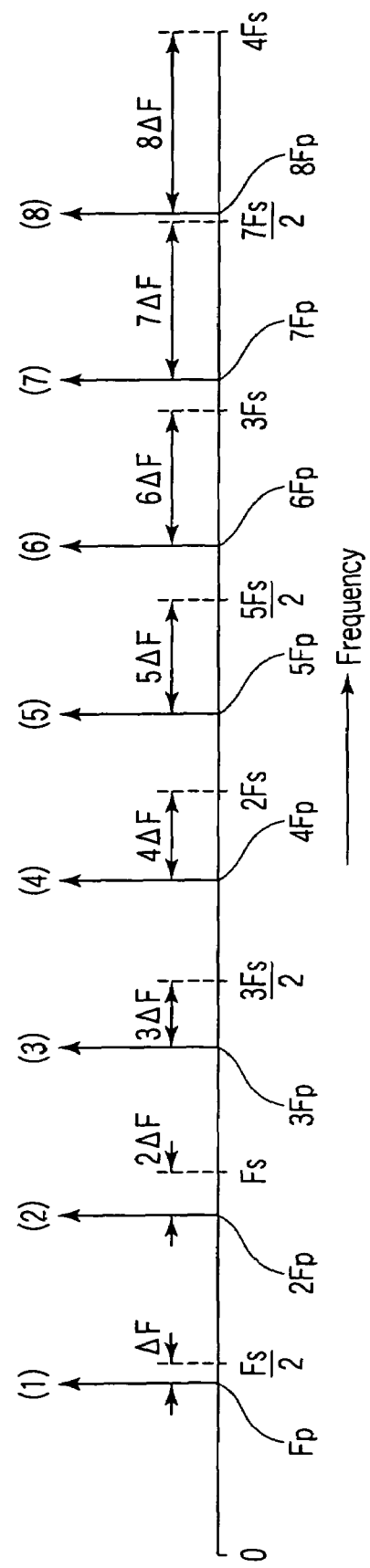
FIG. 3A is a view showing a spectrum example of a calibration signal for use in the time-interleaved analog-to-digital converter shown in FIG. 1 for the purpose of explanation.

For example, when N=8, as shown in FIG. 3A, when a frequency Fp that is lower than a frequency Fs/1 by ΔF is defined as the lowest frequency in a frequency bandwidth in which 4 (=N/2) times of the sampling frequency Fs, let us consider a calibration signal r(t) including signal components 1 to 8 (represented by circled numbers in the figure and so referred to as hereinafter) of frequencies 2Fp, . . . , 8Fp that is an integer times of the lowest frequency.

Here, the levels of signal components 1 to 8 are equal to each other.

Figure 3B:
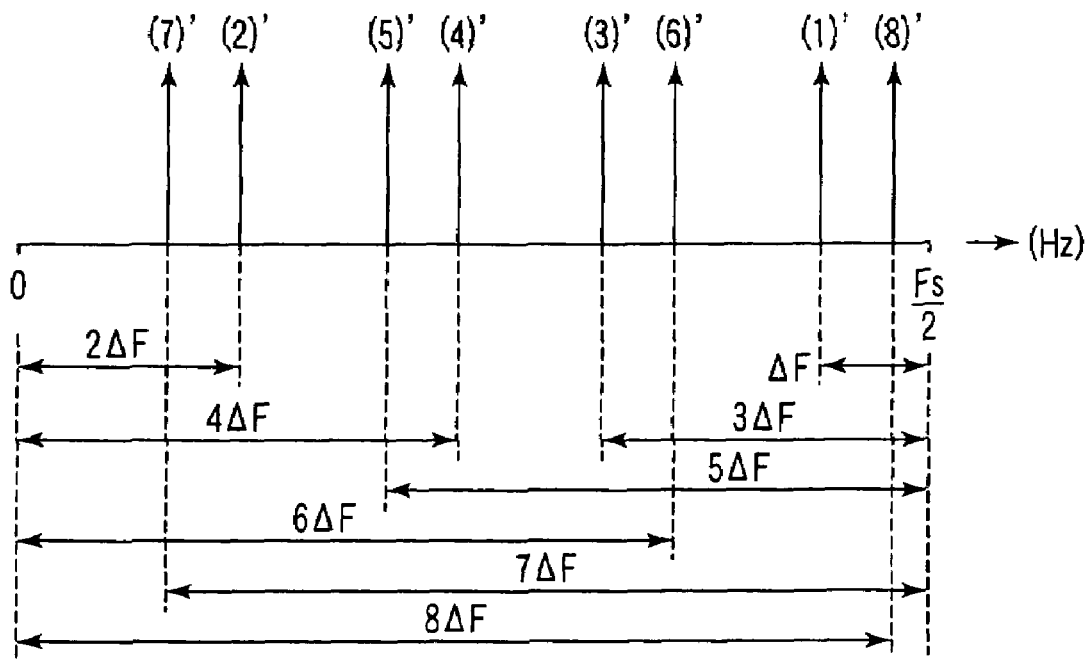
FIG. 3B is a view showing a spectrum example of a calibration signal for use in the time-interleaved analog-to-digital converter shown in FIG. 1 for the purpose of explanation.

From among these components, component 1 having the frequency Fp that is lower than the frequency Fs/2 is analog-to-digital-converted as signal component 1' at a position that is lower by ΔF than the frequency Fs/2 as it is, in each of the analog-to-digital converters $12_0$ to $12_{N-1}$, as shown in FIG. 3B.

In addition, component 2 of the frequency 2Fp that is higher than the frequency Fs/2 and that is lower than a frequency Fs is analog-to-digital-converted as signal component 2' of a frequency 2ΔF that is equal to a difference from the frequency Fs by inverting the frequency 2Fp while the frequency Fs is set at the position of the frequency$_0$ in a bandwidth at a frequency equal to or smaller than the frequency Fs/2, as shown in FIG. 3B.

Further, component 3 of a frequency 3Fp that is higher than the frequency Fs and that is lower than a frequency 3Fs/2 is analog-to-digital-converted as signal component 3' of a frequency equal to a difference from the frequency Fs (i.e., a frequency lower by 3ΔF than the frequency Fs/2) by inverting the frequency 3Fp while the frequency Fs is set at the position of the frequency$_0$ in a bandwidth equal to or smaller than the frequency $12_0$ to $12_{N-1}$, as shown in FIG. 3B, in each of the analog-to-digital converters $12_0$ to $12_{N-1}$.

Similarly, frequency components 4, 6, and 8 that are even-numbered multiples of Fp are analog-to-digital-converted as signal components 4', 6', and 8' of frequencies 4ΔF, 6ΔF, and 8ΔF equal to a difference from frequencies 2Fs, 3Fs, and 4Fs, respectively, by inverting each of the even-numbered multiples of Fp while the frequencies 2Fs, 3Fs and 4Fs are set at the position of the frequency$_0$, respectively, as shown in FIG. 3B, in a bandwidth equal to or smaller than the frequency Fs/2.

In addition, frequency components 5 and 7 that are odd-numbered multiples of Fp are analog-to-digital-converted as signal components 5' and 7' of a frequency equal to a difference from the frequencies 2Fs and 3Fs, respectively, namely, a frequency that is lower by 5ΔF and 7ΔF, respectively, than the frequency Fs/2, in a bandwidth equal to or smaller than the frequency Fs/2 while the frequencies 2Fs and 3Fs, respectively, are set at the position of the frequency$_0$, as shown in FIG. 3B, in each of the analog-to-digital converters $12_0$ to $12_{N-1}$.

Here, for example, when Fs/2 is equal to ΔF, the odd-numbered components 1', 3', 5', and 7' overlap at a position of the frequency$_0$, and the even-numbered components 2', 4', 6', and 8' overlap at a position of the frequency Fs/2.

In addition, assuming that Fs/2 is equal to 3ΔF, the components 1', 2', 4', 5', 7', and 8' overlap at a position of the frequency Fs/3, the components 3' and 6' overlap at the position of the frequency$_0$.

In addition, assuming that Fs/2 is equal to 5ΔF, the components 1' and 4' overlap at a frequency 2Fs/5, the components 2', 3', 7' and 8' overlap at a frequency Fs/5.

In addition, assuming that Fs/2 is equal to 7ΔF, the components 1', 6' and 8' overlap at a frequency 6Fs/14, the components 2' and 5' overlap at a frequency Fs/7, and the components 3' and 4' overlap at a frequency 2Fs/7.

Further, assuming that Fs/2 is equal to 9ΔF, the components 1' and 8' overlap at a frequency 4Fs/9; the components 2' and 7' overlap at a frequency Fs/9; the components 3' and 6' overlap at a frequency 2Fs/9; and the components 4' and 5' overlap at a frequency 4Fs/9.

On the other hand, in the case where Fs/2 is equal to 2ΔF, the odd-numbered components 1', 3', 5', and 7' overlap at a position of a frequency Fs/4; the even-numbered components 2', 4', 6', and 8' overlap at a position of a frequency Fs/2.

In addition, in the case where Fs/2 is equal to 4ΔF, the components 1' and 7' overlap at a frequency 3Fs/8; the components 2' and 6' overlap at a frequency Fs/4; and the components 3' and 5' overlap at a frequency Fs/8.

Further, in the case where Fs/2 is equal to 6ΔF, the components 4' and 8' overlap at a frequency Fs/3, and the components 5' and 7' overlap at a frequency Fs/12.

Then, by carrying out a check similar to the above, under a condition that Fs/2 is equal to an integer multiple, in the case where 8 signal components enters a bandwidth in which N/2 times of Fs is defined as an upper limit, as long as Fs/2 is an even-numbered multiple of 8 or more of ΔF or an odd-numbered multiple of 17 or more of ΔF, it is possible to judge that all of the frequencies of the components 2' to 8' appeared in a bandwidth in which the frequency Fs/2 is defined as an upper limit and in a bandwidth equal to or smaller than the frequency Fs/2 are different from each other.

In general, when n signal components enters a bandwidth in which N/2 times of Fs is defined as an upper limit under a condition that Fs/2 is equal to an integer multiple of ΔF, as long as Fs/2 is an even-numbered multiple equal to or smaller than n of ΔF or an odd-numbered multiple equal to or greater than 2n−1, it is possible to say the frequencies of n components appearing in a bandwidth equal to or smaller than the frequency Fs/2 do not overlap each other by means of sampling, including a folding component.

Figure 4:
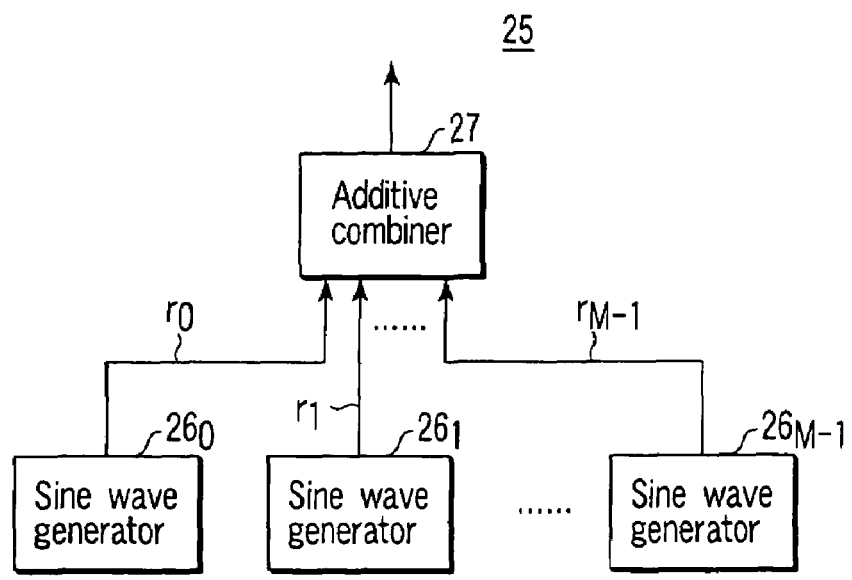
FIG. 4 is a block diagram depicting a specific configuration of essential portions in the time-interleaved analog-to-digital converter shown in FIG. 1 for the purpose of explanation.

As constituent elements of the signal generator 25 that generates a calibration signal r(t) meeting the above-described condition, as shown in FIG. 4, a plurality of M sine wave generators $26_0$ to $26_{M-1}$ are obtained by adding and combining sine wave signals $r_0$ to $r_{M-1}$ of frequencies Fp, 2Fp, 3Fp, ..., MFp to be output by an additive combiner.

In addition, in order to generate a signal that includes a plurality of signal components established in the multiple relationship as described above with a simpler configuration, as shown in FIG. 5A, a pulse signal of a width Wp and a cycle Tp (=1/Fp) can be used as a calibration signal.

Figure 5B:
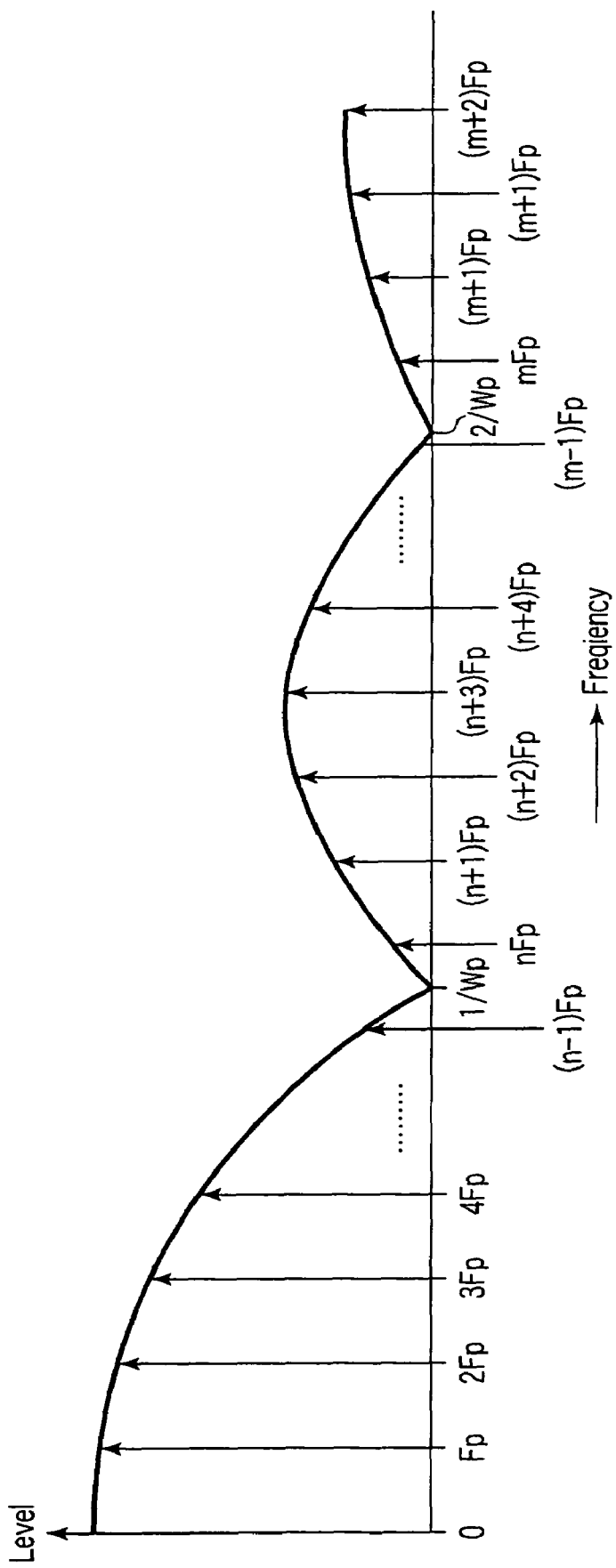
FIG. 5B is a view showing a waveform and a spectrum of a calibration signal for use in the time-interleaved analog-to-digital converter shown in FIG. 1 for the purpose of explanation.

This pulse signal includes a basic wave component of the frequency Fp and high harmonic wave components of frequencies 2Fp, 3Fp, ..., as shown in FIG. 5B, and a calibration signal including the plurality of frequency components described above can be generated by a single pulse signal source.

However, as shown in FIG. 5B, the level of each of the frequency components included in the pulse signal has periodicity that 0 is obtained at a frequency interval of 1/Wp, and gradually attenuates.

If the level is extremely reduced, signal-to-noise ratio is lowered, and analysis cannot be correctly carried out. Thus, the frequency components included in the above-described calibration signal requires a certain degree of magnitude, and it is desirable that its level difference be small.

Further, in the case where the high harmonic wave as described above has been used, there exists a high-order high harmonic wave component that exceeds an input frequency bandwidth of the whole equipment in which N/2 times of the sampling frequency Fs is defined as an upper limit. Moreover, if an attempt is made to increase the level of the frequency component in that bandwidth and to reduce the level difference, the level of the high-order high harmonic wave component outside of the bandwidth is also inevitably increased.

Therefore, ideally, it is desirable that an aliasing component of this extra-bandwidth high-order high harmonic wave should not overlap on an intra-bandwidth aliasing component (a desired signal component).

From among these extra-bandwidth high harmonic wave components, while one having a frequency sufficiently distant from NFs/2 can be remarkably suppressed by a bandwidth limiting filter, a remarkable suppression effect by the filter cannot be expected with respect to those close to NFs/2.

Therefore, realistically, with respect to one having a predetermined level difference or more, there is a need for obtaining correction information while a frequency overlap is allowed or while a component of that frequency is eliminated.

Now, an example of a practically usable calibration signal is shown.

Figure 6:
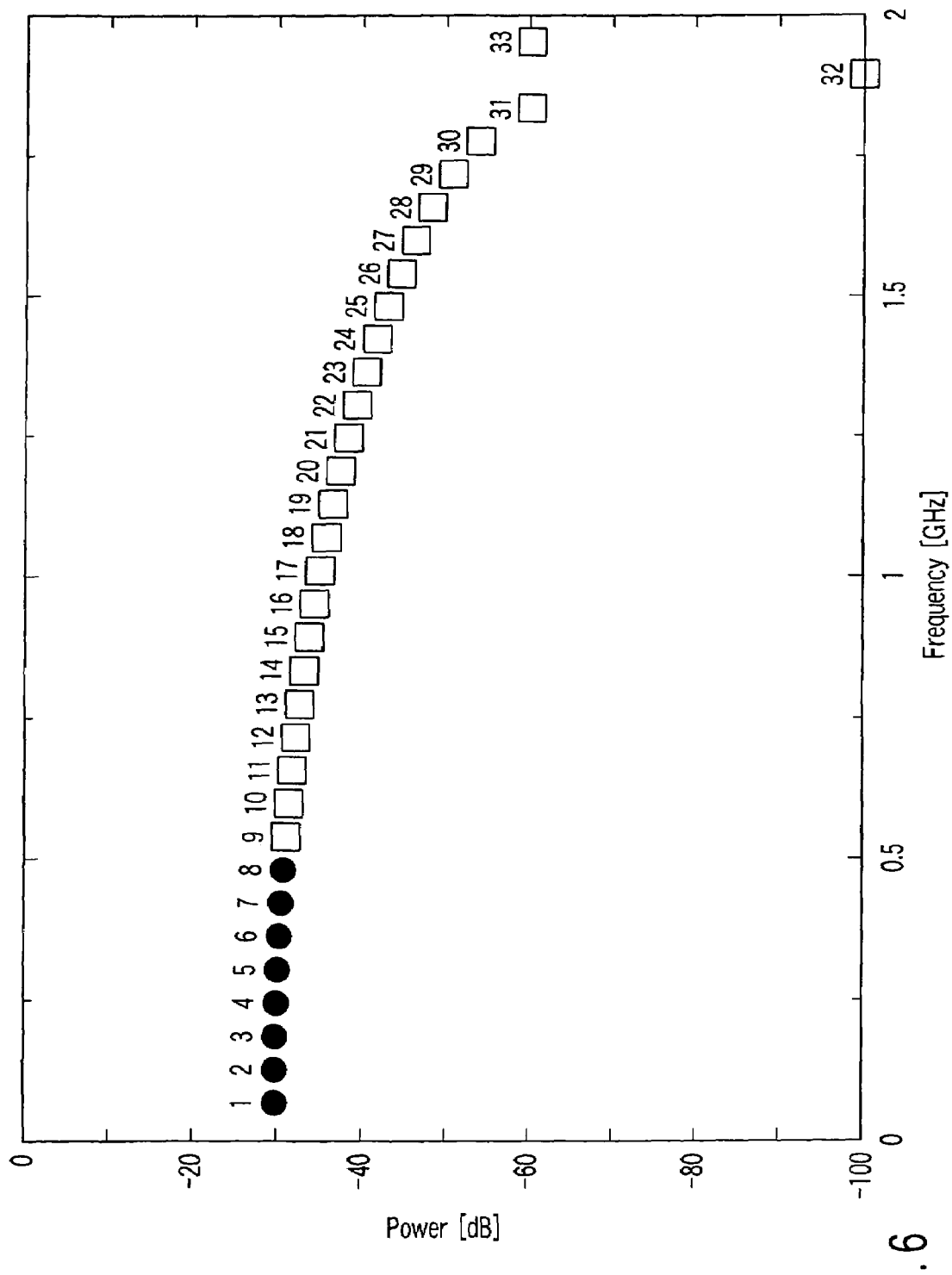
FIG. 6 is a view showing a spectrum at the time of inputting a calibration signal for use in the time-interleaved analog-to-digital converter shown in FIG. 1 for the purpose of explanation.

FIG. 6 is a spectrum distribution chart of a pulse signal having Fp=59.375 MHz and a duty ratio of (100×Wp/Tp)= 3.125 used as a calibration signal when N=M=8 and a sampling frequency fs=125 MHz.

In FIG. 6, 8 frequency components (numbers 1 to 8) indicated by filled circles, the components existing in a bandwidth in which N·Fs/2=500 MHz is defined as an upper limit are signal components used for calibration, and these levels are substantially equal to each other.

Figure 7:
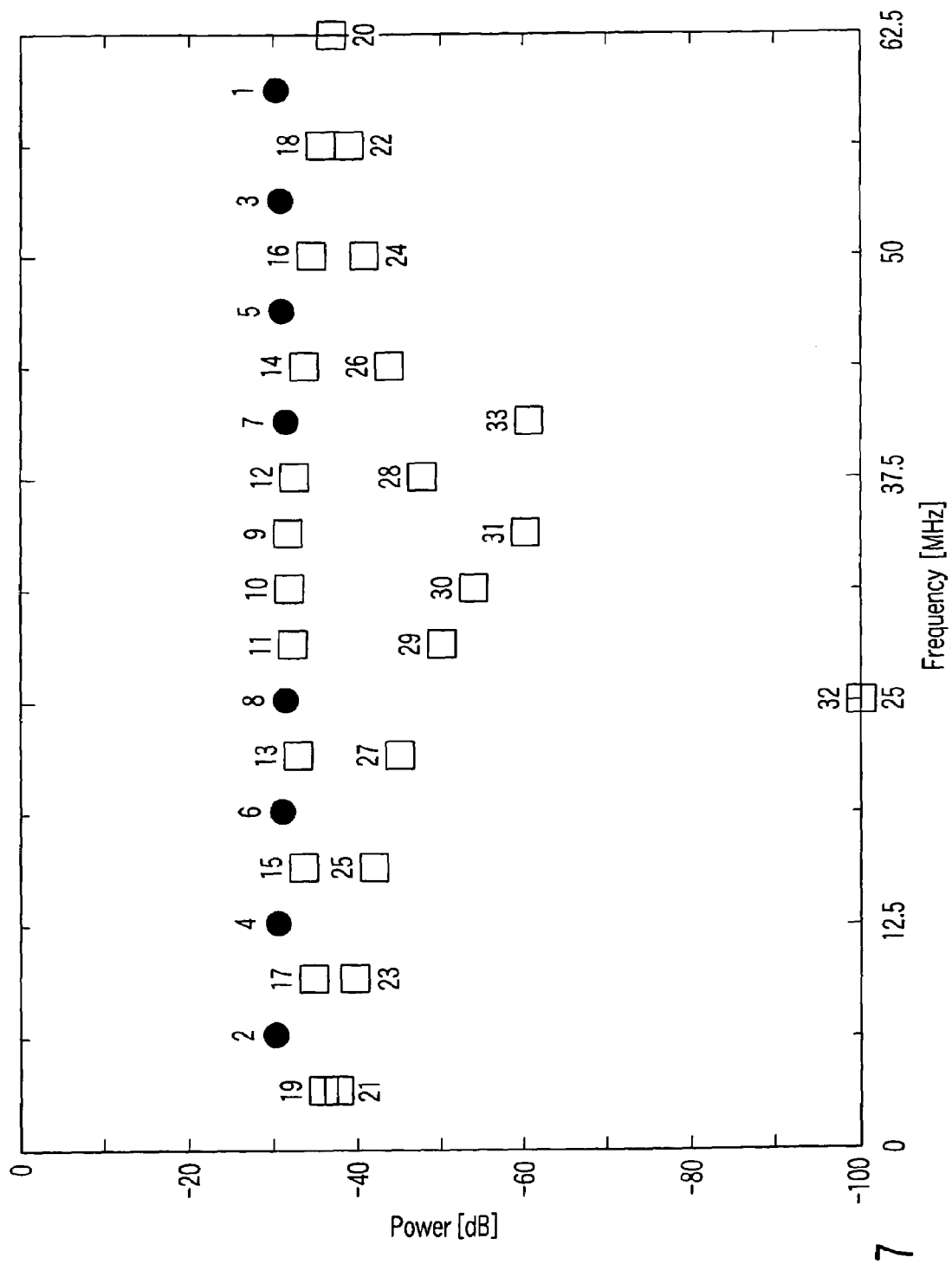
FIG. 7 is a view showing an aliasing spectrum of the calibration signal shown in FIG. 6 for the purpose of explanation.

FIG. 7 is a spectrum distribution chart in the case where a pulse signal having the above-described spectrum distribution has appeared in a bandwidth in which a frequency Fs/2 is defined as an upper limit.

In FIG. 7, component 1 in the bandwidth in which the frequency Fs/2 is defined as an upper limit and aliasing components 2 to 8 in a bandwidth equal to or smaller than the frequency Fs/2 appears at their frequency positions which are different from each other, and moreover, do not overlap on aliasing components 9 to 31 of the extra-bandwidth components indicated by rectangles.

In addition, in FIG. 7, frequencies overlap each other with respect to numbers 32 and 8 and numbers 33 and 7.

Hence, in the case, there is no problem as long as a level difference between the overlaps is equal to or greater than the signal-to-noise ratio required at the time of calibration. In the case where a further higher signal-to-noise ratio is required, suppression may be made using a bandwidth limiting filter.

In addition, there is a possibility that 34 and subsequent aliasing components overlap on components 1 to 8 in frequencies.

Hence, in this case, suppression can be easily made using the bandwidth limiting filter because the frequency is distant from Fs/2.

In the case where the level difference between the overlaps fails to meet the required signal-to-noise ratio, its frequency component can be eliminated from subjects of spectrum analysis described later.

Figure 8:
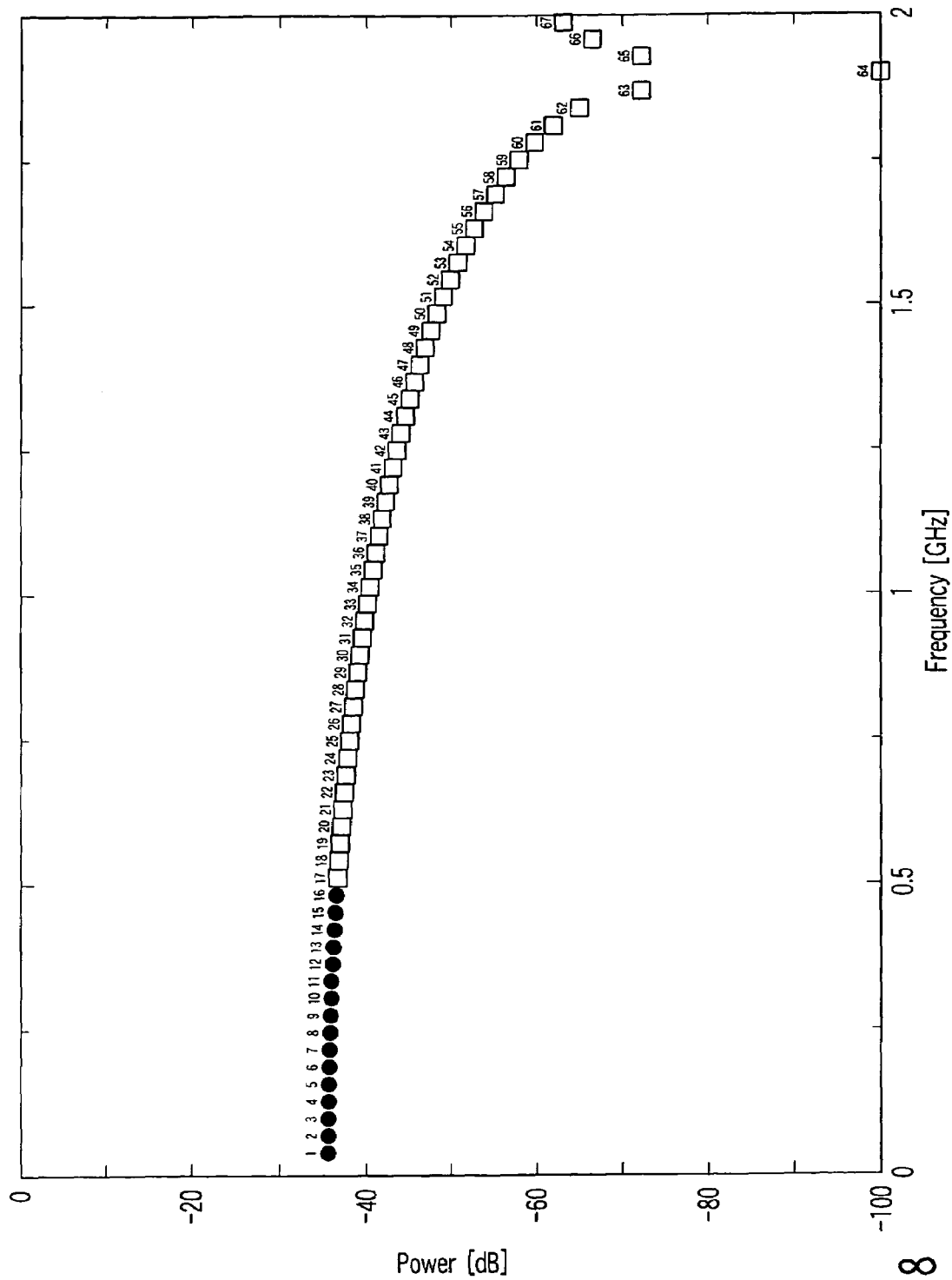
FIG. 8 is a view showing a spectrum at the time of inputting a calibration signal for use in the time-interleaved analog-to-digital converter shown in FIG. 1 for the purpose of explanation.

In addition, FIG. 8 show a spectrum distribution in the case where the frequency Fp of the above-described pulse signal is half times, i.e., in the case where Fp=29.6875 MHz and a duty ratio (100×Wp/Tp)=1.5625.

In FIG. 8, 16 (=M) frequency components (numbers 1 to 16) indicated by filled circles, the components existing in a bandwidth in which 500 MHz is defined as an upper limit are provided as signal components used for calibration, and the levels of these signals are substantially equal to each other.

Figure 9:
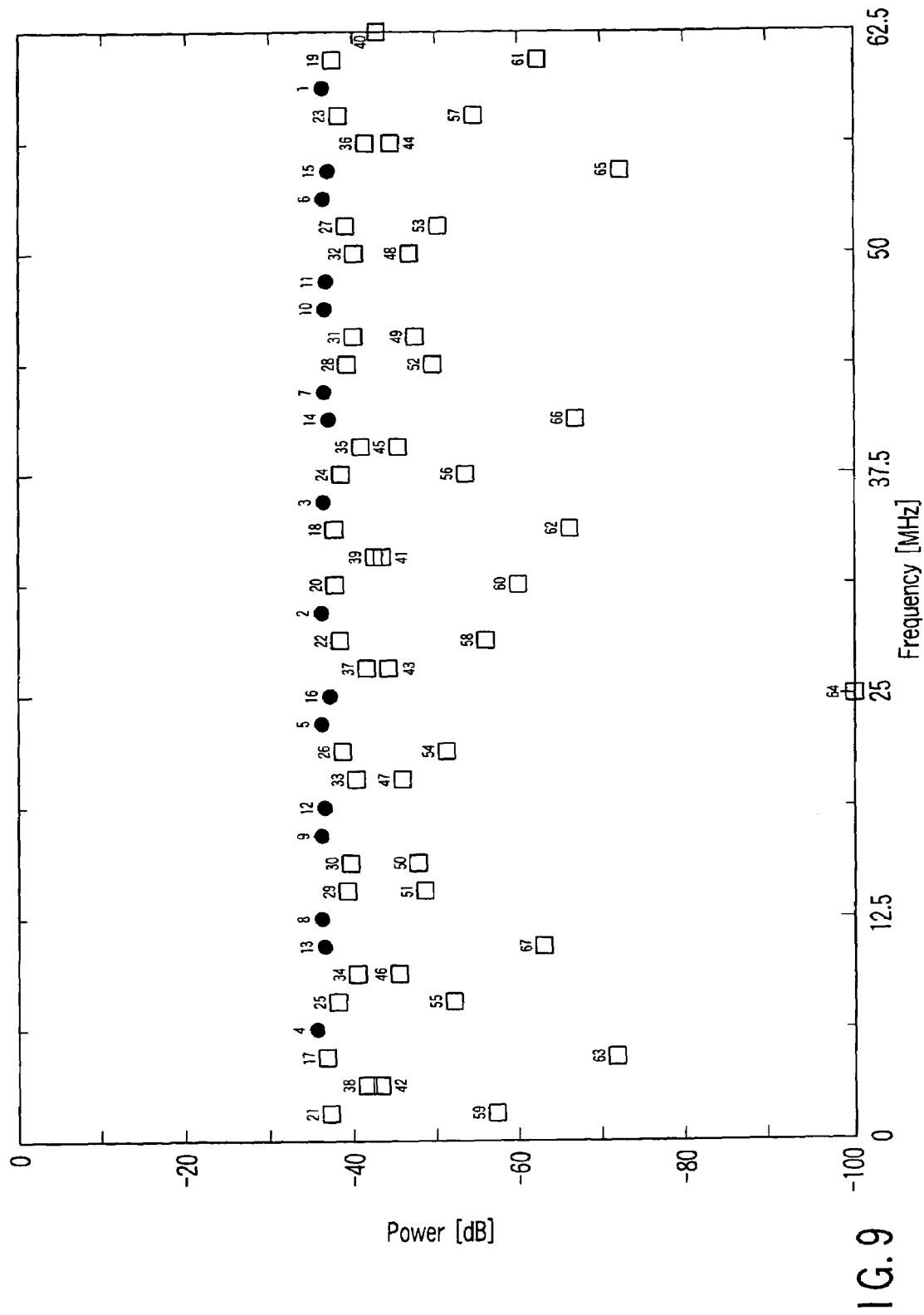
FIG. 9 is a view showing an aliasing spectrum of the calibration signal shown in FIG. 8 for the purpose of explanation.

FIG. 9 is a view showing a spectrum distribution in the case where a pulse signal having the above-described spectrum distribution has been folded in a bandwidth in which a frequency Fs/2 is defined as an upper limit.

In FIG. 9, component 1 in the bandwidth in which the frequency Fs/2 is defined as an upper limit, indicated by filled circles and aliasing components 2 to 16 in a bandwidth equal to or smaller than the frequency Fs/2 appear at frequency positions different from each other, and moreover, do not overlap on aliasing components 17 to 63 indicated by rectangles.

In addition, in FIG. 9, numbers 64 and 16, numbers 65 and 15, numbers 66 and 14, numbers 67 and 13 overlap each other in frequency.

Hence, in this case, in the same manner as that described previously, there is no problem as long as the level difference between the overlaps is equal to or greater than signal-to-noise ratio required at the time of calibration. In the case where a further higher signal-to-noise ratio is required, suppression may be made using the bandwidth limiting filter.

There is a possibility that the aliasing components of numbers 68 and subsequent, although not shown, coincide with components 1 to 16 in frequency.

Hence, in this case, suppression can be easily made using the bandwidth limiting filter because the frequency is distant from Fs/2.

In the case where the level difference between the overlaps fails to meet the required signal-to-noise ratio, its frequency component can also be eliminated from the subject of spectrum analysis described later.

Turning to FIG. 1, digital signal sequences $X_0$ to $X_N$ output from each of the analog-to-digital converters $12_0$ to $12_{N-1}$ are input to a correction processing unit 30.

In accordance with the correction information stored in advance in the correction information memory 35, the correction processing unit carries out a predetermined correction processing such that a result can be obtained so as to be identical to that obtained when an analog-to-digital conversion processing having the same characteristics has been made with respect to the digital signal sequences $X_0$ to $X_{N-1}$ in each of the analog-to-digital converters $12_0$ to $12_{N-1}$.

Digital signal sequences $y_0$ to $y_{N-1}$ corrected by this correction processing unit 30 are output to a signal switching device 14.

Here, an arbitrary processing according to the precision required for the time-interleaved analog-to-digital converter 20 can be carried out as a technique of a correction processing at the correction processing unit 30.

As a specific example of the correction processing at the correction processing unit 30, it is considered that a filtering processing is made by a digital filter in order to made uniform the amplitude characteristics and phase characteristics of all the processing paths (for example, in order to adjust the characteristics of all the processing paths to characteristics of one processing path).

In this case, information required for correction is provided as a filter coefficient of a digital filter, and the correction information memory 35 stores a filter coefficient for a filtering processing to be carried out with respect to the digital signal sequences $X_0$ to $X_{N-1}$ output from each of the analog-to-digital converters $12_0$ to $12_{N-1}$.

The signal switching device 14 having received the digital signal sequences $y_0$ to $y_{N-1}$ corrected by this correction processing unit 30 sequentially selects the digital signal sequences $y_0$ to $y_{N-1}$ at a timing delayed by a timing interval required for a correction processing, and then, outputs the thus selected signal trains as digital signal sequences Y(n) in time series.

A control unit 40 connects the switch 21 to the side of an input terminal 10a during a period in which an analog-to-digital conversion processing is requested for an input signal x(t), and then, inputs a to-be-measured signal x(t) to a signal divider 11, whereby the digital signal sequences Y(n) in which the corrected digital signal sequences $y_0$ to $y_{N-1}$ have been arranged in time series are output from an output terminal 10b.

While this analog-to-digital conversion processing is in progress, the control unit 40 stops an oscillating operation of a signal generator 25, thereby preventing the correction signal r(t) from leaking from the switch 21 to the signal divider 11 side.

When calibration is requested in accordance with an external instruction or a predetermined schedule, the control unit 40 connects the switch 21 to the signal generator 25 side, and inputs the calibration signal r(t) to the signal divider 11.

As is the case with the to-be-measured signal x(t), this calibration signal r(t) is analog-to-digital-converted by each of the analog-to-digital converter $12_0$ to $12_{N-1}$, and each of the frequency components included in that calibration signal r(t) appears in a bandwidth in which a frequency Fs/2 is defined as an upper limit, including a aliasing component, as described previously.

A correction information calculating unit 41 carries out a spectrum analysis (for example, fast Fourier transformation [FTT]) relevant to the digital signal sequences $X_0$ to $X_{N-1}$ that each of the analog-to-digital converters $12_0$ to $12_{N-1}$ outputs in response to the correction signal r(t), thereby obtaining the amplitude and phase of the plurality of signal components described previously.

Then, the correction information calculating unit 41 newly obtains correction information required for the correction processing, based on the thus obtained amplitude, phase, and frequency, and then, updates the contents of the correction information memory 35 in accordance with the newly obtained correction information.

In this case, the correction information calculating unit 41, for example, obtains, by means of spectrum analysis, amplitudes $V_0(1)$ to $V_0(8)$, $V_1(1)$ to $V_1(8)$, ..., $V_{N-1}(1)$ to $V_{N-1}(8)$ and phases (initial phases) $\Phi_0(1)$ to $\Phi_0(8)$, $\Phi_1(1)$ to $\Phi_1(8)$, ..., $\Phi_{N-1}(1)$ to $\Phi_{N-1}(8)$ with respect to a plurality of signal components (1' to 8' described previously), respectively, appearing in a bandwidth in which a frequency Fs/2 is defined as an upper limit, for example.

The amplitudes used here actually include errors, although it is ideal that they are equal to each other with respect to processing paths.

Therefore, while each of the amplitudes $V_0(1)$ to $V_0(8)$ of frequency components 1' to 8' obtained by spectrum analysis in response to an output of the analog-to-digital converter $12_0$, for example, is defined as a reference, the correction information calculating unit 41 obtains an amplitude error (amplitude ratio) as follows:

$$\Delta V(1, 1)=V_1(1)/V_0(1)$$

$$\Delta V(1, 2)=V_1(2)/V_0(2)$$

...

$$\Delta V(1, 8)=V_1(8)/V_0(8)$$

$$\Delta V(2, 1)=V_2(1)/V_0(1)$$

$$\Delta V(2, 2)=V_2(2)/V_0(2)$$

...

$$\Delta V(2, 8)=V_2(8)/V_0(8)$$

...

$$\Delta V(N-1, 1)=V_{N-1}(1)/V_0(1)$$

$$\Delta V(N-1, 2)=V_{N-1}(2)/V_0(2)$$

...

$$\Delta V(N-1, 8)=V_{N-1}(8)/V_0(8)$$

The phase used here includes a sampling timing difference and an error, respectively, with respect to each of the processing paths.

Therefore, while each of the phases $\Phi_0(1)$ to $\Phi_0(8)$ of frequency components 1' to 8' obtained by spectrum analysis in response to an output of the analog-to-digital converter $12_0$, for example, is defined as a reference, the correction information calculating unit 41 obtains a difference after eliminating a phase component $\theta_t(j)$ equivalent to the sampling timing difference.

$$\Delta \Phi(1, 1)=\Phi_1(1)-\Phi_0(1)-\theta_1(1)$$

$$\Delta \Phi(1, 2)=\Phi_1(2)-\Phi_0(2)-\theta_1(2)$$

...

$$\Delta \Phi(1, 8)=\Phi_1(8)-\Phi_0(8)-\theta_1(8)$$

$$\Delta \Phi(2, 1)=\Phi_2(1)-\Phi_0(1)-\theta_2(1)$$

$$\Delta \Phi(2, 2)=\Phi_2(2)-\Phi_0(2)-\theta_2(2)$$

...

$$\Delta \Phi(2, 8)=\Phi_2(8)-\Phi_0(8)-\theta_2(8)$$

...

$$\Delta \Phi(N-1, 1)=\Phi_{N-1}(1)-\Phi_0(1)-\theta_{N-1}(1)$$

$$\Delta \Phi(N-1, 2)=\Phi_{N-1}(2)-\Phi_0(2)-\theta_{N-1}(2)$$

...

$$\Delta \Phi(N-1, 8)=\Phi_{N-1}(8)-\Phi_0(8)-\theta_{N-1}(8)$$

In this manner, the correction information calculating unit 41 obtains information required for the correction processing by filtering or the like, from the amplitude error and phase error obtained while the characteristics of the signal paths of one analog-to-digital converter $12_0$ are defined as a reference.

In addition, the correction information calculating unit 41, for example, calculates frequency characteristics of a difference while one analog-to-digital converter $12_0$ is defined as a reference, as described above. And the frequency characteristics is inversely FTT-computed to obtain an impulse response, thereby isolating the thus obtained impulse response by the number of taps for required precision, and using a filter coefficient used by a filtering processing.

At this time, the correction information calculating unit 41 carries out an interpolation processing as required, thereby allocating the number of data items required for calculation of the impulse response.

In addition, the phase error of a sampling clock steadily is included in the above calculated phase error. Thus, a configuration is provided so as to enable correction of the phase of the sampling clock output from the sampling control unit 13. Therefore a phase shift quantity of the sampling clock is controlled to be corrected so that the steady error in the above calculated phase error is minimized, and then, the filter coefficient of the digital filter described previously can be determined.

In this manner, the time-interleaved analog-to-digital converter 20 according to the first embodiment inputs as a calibration signal r(t) a signal existing at a predetermined frequency interval in a bandwidth in which N/2 times of a frequency Fs is defined as an upper limit, the signal including, at the same time, a plurality of signal components having different frequencies from each other when the frequencies appear in the bandwidth in which half of the frequency Fs is defined as an upper limit by means of the sampling of each of the analog-to-digital converters. Then time-interleaved analog-to-digital converter 20 carries out a spectrum analysis relevant to a signal output from each of the analog-to-digital converters in response to the calibration signal r(t) and obtains the amplitude and phase of a plurality of signal components; and obtains and updates information required for the correction processing, based on the amplitude and phase.

Thus, the time-interleaved analog-to-digital converter 20 according to the first embodiment can obtain information required for correction within a short period of time, as compared with a case in which a sine wave signal having a single frequency is defined as a calibration signal, as in a conventional time-interleaved analog-to-digital converter 10, and can carry out a required calibration processing without stopping the analog-to-digital conversion processing relevant to a to-be-measured signal for a long period of time.

Therefore, as in a high speed signal processing system according to a fifth embodiment of the present invention described later, even in the case where the processing system is provided as a system that steadily carries out a signal monitoring processing, and is easily affected by an environmental change, high conversion precision can be maintained without sacrificing a conversion processing relevant to an input signal.

Now, a description will be given with respect to an example of a processing at a correction processing unit 30.

One of the processing modes at the correction processing unit 30 can include a following method, while one of a plurality of analog-to-digital converters is defined as a reference. That is a method storing in advance in an AD characteristic table of a correction information memory 35 a coefficient of a filter having an impulse response that meets characteristics of a difference between the frequency characteristics of each of the signal paths and the frequency characteristics of the analog-to-digital converter defined as a reference, and, based on sample values output from the plurality of analog-to-digital converters and the coefficients stored in the AD characteristic table, estimating a sample value to be obtained assuming that another one of the analog-to-digital converters has carried out a conversion processing at a timing at which the analog-to-digital converter having received a sampling clock updates the sample value.

The processing mode based on this estimation makes uniform the frequency characteristics of each signal path, and is included in the correction processing.

In addition, in addition to the processing mode based on this estimation, another processing mode can be considered. Namely a coefficient of a filter having an impulse response that meets the frequency characteristics of offsetting a difference between the frequency characteristics of the analog-to-digital converter defined as a reference and each of the analog-to-digital converters is stored in advance in an equalizer coefficient table, an equalizing processing unit (equalizer) carries out filtering operations based on the coefficients stored in the equalizer coefficient table, respectively, so as to output error-corrected sample values, respectively.

First, a description will be given with respect to a technique that is a prerequisite of the above-described correction processing.

First, from among N analog-to-digital converters $12$ described previously, a reference analog-to-digital converter is arbitrarily defined. Frequency characteristics including input characteristics or conversion characteristics from an input terminal $10a$ to the analog-to-digital converters and phase error characteristics of a sampling system are calculated for each of the analog-to-digital converter. And a difference between the calculated frequency characteristics and the frequency characteristics relevant to the reference analog-to-digital converter is obtained, thereby defining the obtained difference as mismatch characteristics.

In addition, assume that a to-be-measured signal $x(t)$ is bandwidth-limited by 0 to Fs'/2 when a clock frequency of high speed sampling achieved using N analog-to-digital converters is defined as Fs' ($=N \cdot Fs$).

Next, mismatch circuits having mismatch characteristics are interposed at a front stage of their respective analog-to-digital converters. The frequency characteristics are defined as $H_i(\omega)$ (i=0, 1, . . . , N-1), and further, equalization characteristics $G_i(\omega)$ of a virtual equalizer for canceling mismatch characteristics $H_i(\omega)$ is defined.

Here, under a condition that an input/output signal is bandwidth-limited within the frequency range of 0 to Fs'/2, in the case where a continuous system has been replaced with a discrete system represented by a sampling cycle Ts' (=1/Fs'), in consideration of mismatch characteristics $H_i^*(\omega)$ and equalizing characteristics $G_i^*(\omega)$ that indicate the input/output characteristics equal to mismatch characteristics $H_i(\omega)$ and equalizing characteristics $G_i(\omega)$, impulse responses $h_{i,u}$ and $g_{i,k}$ corresponding to these characteristics are calculated in accordance with the formula below.

The lengths u and k of an impulse train are adjusted according to required precision.

$$G_i^*(\omega) = 1 H_i^*(\omega) \tag{1}$$

$$h_{i,u} = F{-1}\{H_i^*(\omega)\} \tag{2}$$

$$g_{i,k} = F{-1}\{G_i^*(\omega)\} \tag{3}$$

wherein i=0, 1, . . . , N

Symbol F−1 indicates discrete Fourier inverse-transform computation.

Figure 11:
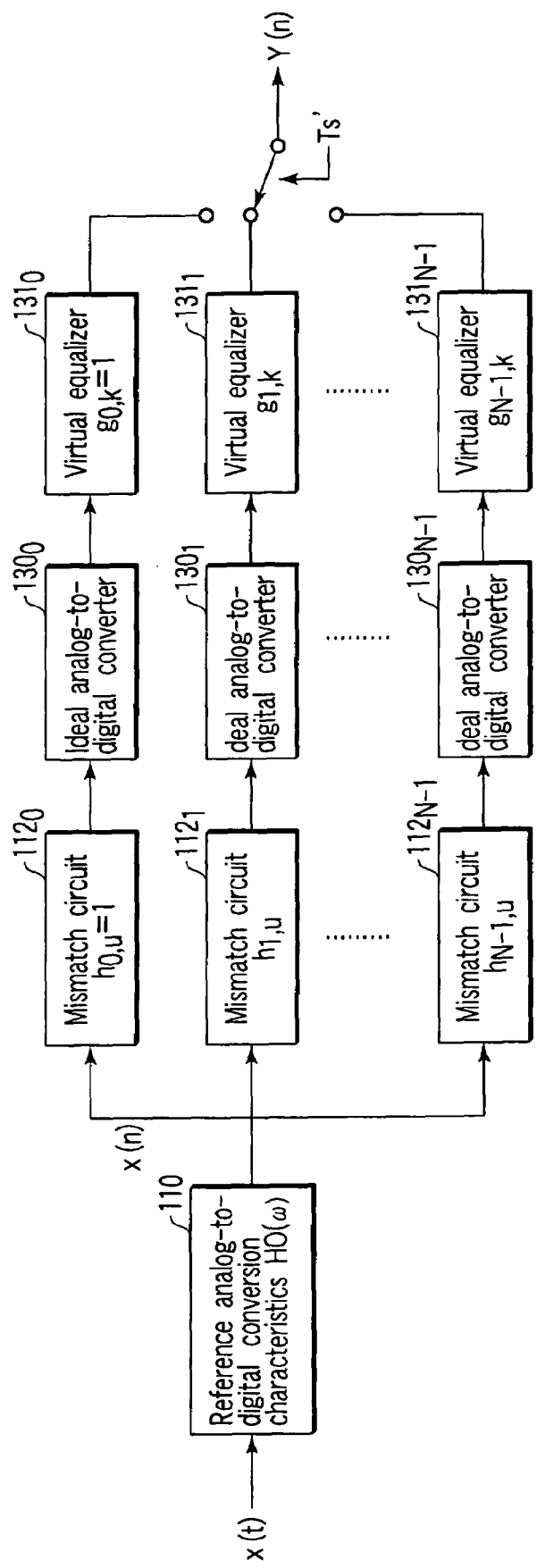
FIG. 11 is a block diagram depicting a configuration of essential portions for explaining a presumed technique of a correction processing by the time-interleaved analog-to-digital converter shown in FIG. 1.

Here, let us consider an equalizer circuit shown in FIG. 11 while an analog-to-digital converter $12_0$ is defined as a reference.

That is, in this case, with respect to analog-to-digital conversion by each of the analog-to-digital converters $12_1$ to $12_{N-1}$, the mismatch component relevant to the reference analog-to-digital converter $12_0$ is converted into the mismatch circuit characteristics. Thus, as shown in the equalizer circuit of FIG. 11, this analog-to-digital conversion is equivalent to a case in which a signal $x(n)$ obtained by converting a to-be-measured signal $x(t)$ into a discrete system in accordance with conversion characteristics $10$ of the reference analog-to-digital converter $12_0$ is passed through the mismatch circuits $112_0$ to $112_{N-1}$ relevant to each of the analog-to-digital converters, and then, the passed signal is analog-to-digital-converted by ideal analog-to-digital converters $130_0$ to $130_{N-1}$ without an error.

Further, the digital data sequentially output from the ideal analog-to-digital converters $130_0$ to $130_{N-1}$ are input to virtual equalizers $131_0$ to $130_{N-1}$, respectively. And after an equalizing processing is carried out to the digital data by an equalizer which is defined with respect to each of the individual analog-to-digital converters (defined by impulse response $g_{i,k}$), the digital data are output from each of the virtual equalizers $131_0$ to $131_{N-1}$ as sample values $Y(n)$.

In the following description, for the sake of simplification, the reference analog-to-digital conversion characteristics $110$ are assumed such that a to-be-measured signal is transmitted to an output terminal side as it is.

Hence, this reference analog-to-digital conversion characteristics $110$ may be corrected as required.

In the above-described equalizer circuit, when a length u of an impulse train that represents frequency characteristics of each of the mismatch circuits $112_0$ to $112_{N-1}$ is equally expressed by U, an input $x_{i,n}$ of each of the ideal analog-to-digital converters $130_0$ to $130_{N-1}$ can be represented by the formula below.

$$X_{i,n} = u\Sigma x(n-u) \cdot h_{i,u} \tag{4}$$

wherein i=0, 1, . . . , N−1

Symbol $u\Sigma$ indicates a sum of u=−(U−1) to (U−1).

Here, a sampling timing of each of the analog-to-digital converters $12_0$ to $12_{N-1}$ is made equal to a sampling timing of each of the ideal analog-to-digital converters $130_0$ to $130_{N-1}$, analog-to-digital-convert the input value $x_{i,n}$ in a cycle T. And then, the ideal analog-to-digital converters $130_0$ to $130_{N-1}$ output a sample value to the virtual equalizers $131_0$ to $131_{N-1}$ in accordance with the sampling timing of each of the analog-to-digital converters. Thus, assuming that the ideal analog-to-digital converter $130_0$ outputs a P-th sample value, an n-th sample value to be output is to be output from a J(n)-th ideal analog-to-digital converter.

$$X_{J(n),n} = u\Sigma x(n-u) \cdot h_{J(n),u} \tag{5}$$

Symbol $u\Sigma$ indicates a sum of u=−(U−1) to (U−1).

Here, J(n) is a positive value while N is defined as a normal, and is expressed as follows:

$$J(n) = n - P\mathrm{mod}(N) \tag{6}$$

That is, the individual analog-to-digital converters output data to virtual equalizers on N by N basis with respect to the input value $x_{i,n}$.

Assuming that the ideal analog-to-digital converter outputs a sample value on Ts' basis, the value $x_{i,n}$ output from a mismatch circuit is input to the virtual equalizer as it is. In addition, the equalizer corresponding to the inside of the virtual equalizer functions to correct characteristics of the mismatch circuit in accordance with a definition. Thus, when a coefficient is defined so that a calculation delay of the mismatch circuit and equalizer is obtained as 0, the sample value Y(n) equal to the input value x(n) is output from N virtual equalizers $131_0$ to $131_{N-1}$.

When it is assumed that the ideal analog-to-digital converter has output sample values on Ts' basis, by using the impulse response $g_{i,k}$ of the equalizer defined for each of the analog-to-digital converters, a processing by the equalizers inside of the virtual equalizers $131_0$ to $131_{N-1}$ is defined in accordance with the formula below.

$$Y(n) = k\Sigma x_{J(n), n-k} \cdot g_{J(n), k} \tag{7}$$

wherein K denotes a length of an impulse train of an equalizer, and symbol $k\Sigma$ indicates a sum of $k=-(K-1)$ to $K-1$.

Here, in order to establish Formula (7) above, with respect to $x_{J(n), n-k}$, while all values are required for $k=-(K-1)$ to $K-1$, each of the actual analog-to-digital converters can only output values every N, as described previously.

Therefore, using a sample value of another one of the analog-to-digital converter, a sample value required for equalization is estimated, and then, an equalizing computing processing shown in Formula (7) is carried out.

Further, from among n-th output candidates calculated by the virtual equalizers $131_0$ to $131_{N-1}$, an output from a J(n)-th virtual equalizer having the smallest error (in the case where a computational delay is defined as 0) is output as a sample value Y(n).

Here, in order to estimate a J(n)-th analog-to-digital conversion result, let us consider a case in which analog-to-digital conversion output other than the J(n)-th analog-to-digital conversion is as follows:

$$X_{J(n-r), n-r-k} \tag{8}$$

Wherein $r \ne q \times N$ (q: 0, ±1, ±2 . . . )

In this case, an (n−r−P) mod (N)-th analog-to-digital converter has an n−r-th value. Based on a definition, the n−r-th input value x (n−r) is equal to an equalized output value Y (n−r). Thus, the following formula is established.

$$X(n-r) = Y(n-r) \tag{9}$$
$$= k\sum x_{J(n-r), n-r-k} \cdot g_{J(n-r), k}$$

wherein $k\Sigma$ indicates a sum of $k=-(K-1)$ to $K-1$

In addition, in Formula (4), assuming that an ideal analog-to-digital converter shifts a sampling timing, and then, a J (n)-th analog-to-digital converter carries out the n−r-th sampling, the sample value $X_{J(n), n-r}$ is obtained as follows:

$$X_{J(n), n-r} = u\Sigma x(n-r-u) \cdot h_{J(n), u} \tag{10}$$

wherein symbol $u\Sigma$ indicates a sum of $u=-(U-1)$ to $U-1$.

By substituting Formula (9) for Formula (10) above, an estimated sample value $x_{J(n), n-r}$ is obtained, and then, the processing of Formula (7) described previously is carried out with respect to the thus obtained estimated sample value, whereby an output value y(n) can be obtained by N analog-to-digital converters.

Figure 12:
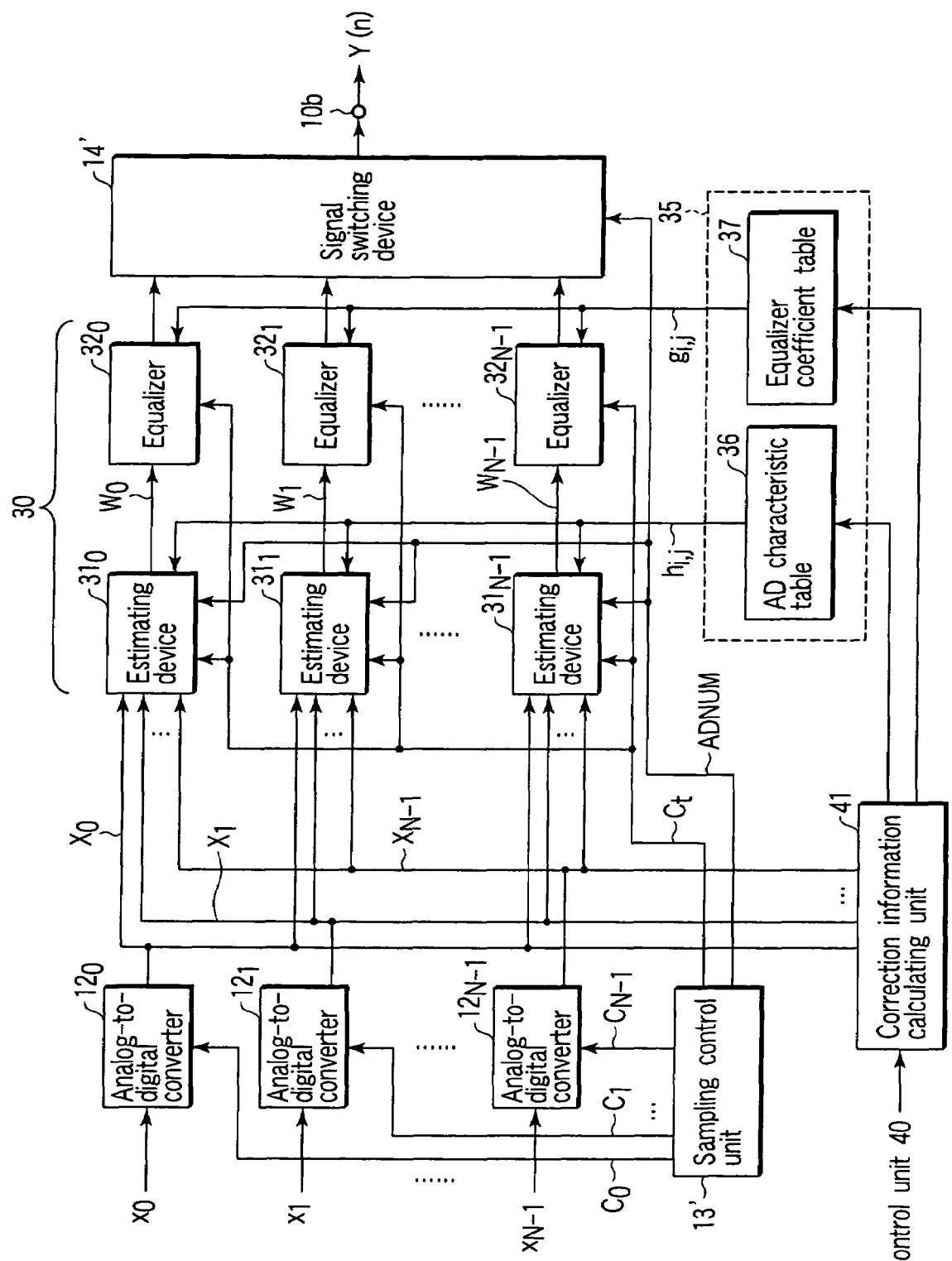
FIG. 12 is a block diagram depicting a configuration of essential portions for explaining a correction processing by the time-interleaved analog-to-digital converter shown in FIG. 1.

FIG. 12 shows a configuration of essential portions in the case where the analog-to-digital converter 20 shown in FIG. 1 carries out a correction processing based on the above presumptive technique (although an input portion is not shown).

In this case, the correction processing unit 30 is composed of N estimating devices $31_0$ to $31_{N-1}$ and equalizers $32_0$ to $32_{N-1}$.

In addition, the correction information memory 35 is composed of an AD characteristic table 36 and an equalizer coefficient table 37.

Outputs from the analog-to-digital converters $12_0$ to $12_{N-1}$ are input to the estimating devices $31_0$ to $31_{N-1}$ of the correction processing 30, respectively.

The estimating devices $31_0$ to $31_{N-1}$ receives outputs from a plurality of N analog-to-digital converters $12_0$ to $12_{N-1}$ and a specified signal ADNUM from a sampling control unit 132'.

Each of the estimating devices $31_0$ to $31_{N-1}$ estimates sample values when it is assumed that an analog-to-digital converter has carried out a sampling operation at a sampling timing preceding by number E defined by a predetermined estimated-value calculating processing, based on the input N sample values and the specified signal ADNUM and coefficient of the analog-to-digital characteristic table 36 described later every one timing indicated by a timing signal Ct.

With respect to the number E defined by the predetermined estimated-value calculating processing, for example, in the case where an estimated value is obtained using 3 sampling points, E=1 or more, and, in the case where an estimated value is obtained using one sampling point, E=0 or more.

For example, in the case where estimation is carried out using 3 sampling points, the number of analog-to-digital converter having an updated sample value is defined as "a" (ADNUM=a), and, positive numbers "b" and "c" in which N is modules are determined in accordance with the formula below.

$$b = a - 1 \bmod(N) \tag{11a}$$

$$c = a - 2 \bmod(N) \tag{11b}$$

Then, when i=b, the estimated sample value $W_{i, n}$ is defined as follows:

$$W_{i, n} = x_{b, n} \tag{12a}$$

In addition, when i≠b, the estimated sample value $W_{i, n}$ is obtained by computation below:

$$W_{i,n} = x_{b,n} \cdot h_{i,0}/h_{b,0} + x_{a,n} \cdot (h_{i,0}/h_{a,0}) \cdot \{(h_{i,-1}/h_{i,0}) - (h_{b,-1}/h_{b,0})\} + x_{c,n} \cdot (h_{i,0}/h_{c,0}) \cdot \{(h_{i,1}/h_{i,0}) - (h_{b,1}/h_{b,0})\} \tag{12b}$$

In the formula, $h_{i,-1}$, $h_{i,0}$, and $h_{i,1}$ are provided as coefficients stored in advance in an AD characteristic table 36.

In addition, the first term of the above formula (12b) is provided as a term mainly relevant to an amplitude error, and the second and third terms thereof are provided as a term mainly relevant to a phase error.

An estimated sample value W output from each estimating device 32 is input to each of the equalizers $32_0$ to $32_{N-1}$.

Each of the equalizers $32_0$ to $32_{N-1}$ carries out an equalizing computing processing with respect to the input estimated sample value W by using a coefficient (filter coefficient) stored in an equalizer coefficient table 37 described later. And then, each of the equalizers $32_0$ to $32_{N-1}$ outputs a sample value y whose error has been corrected with respect to a reference analog-to-digital converter to a signal switching device 14', the sample value being obtained as a result of the operation, at a timing indicated by a timing signal Ct.

The signal switching device 14' receives the sample value output from each of the equalizers $32_0$ to $32_{N-1}$. And then, the signal switching device 14' obtains a value specified by a specifying signal ADNUM (here, referred to as ADNUM=a), a value e for specifying an equalizer by using a number E defined by an estimated-value calculating processing and an offset value a0 defined when defining the equalizer coefficient table 37 in accordance with the following computational formula.

$$e = aE - a0 \bmod(N)$$

Then, the signal switching device 14' selects an output result $Y_e$, n of an e-th equalizer 32e in response to a value a specified by the specifying signal ADNUM, based on the value e for specifying the equalizer obtained by calculation, and outputs the selected result as a final analog-to-digital conversion result Y(n).

The resulting analog-to-digital conversion result is with a delay by a sampling timing of E+a0 through theoretical calculation using an estimated-value calculating processing.

On the other hand, the AD characteristic table 36 stores in advance a coefficient obtained by simplifying a difference $H_i^*(\omega)$ in frequency characteristics of the reference analog-to-digital converter relevant to the frequency characteristics from an input terminal 10a to an output terminal of each analog-to-digital converter in the case where the difference is considered by a discrete system expressed by a sampling cycle Ts' (=Ts/N) (a function expressed by complex, the function including the above-described amplitude error $\Delta V$ and phase error $\Delta \Phi$) with a 3-point impulse response.

Based on the spectrum analysis result of each of the signal components obtained at the time of input of the calibration signal, the correction information calculating unit 41 calculates the above-described difference $H_i^*(\omega)$ in frequency characteristics from frequency characteristics $HO^*(\omega)$ relevant to the reference analog-to-digital converter and frequency characteristics $HO_i^*(\omega)$ relevant to each of the analog-to-digital converters 12₀ to 12_{N-1}.

Differential characteristics $HO_i^*(\omega)$ are obtained as a ratio as follows:

$$H_i^*(\omega)=HO_i^*(\omega)/HO^*(\omega) \quad (13)$$

Next, in the range that meets a sampling theorem, an impulse response equivalent to the frequency characteristics $H_i^*(\omega)$ is obtained in accordance with inverse FFT calculation, and then, an FIR filter having a filter coefficient obtained from that impulse response is designed.

However, at the time of designing the filter having the equivalent impulse response, an absolute delay quantity $\tau 0$ (second) common to all of N filters designed is arbitrarily set, and then, an individual filter design is made.

In the case where the obtained filter coefficients have been expressed as ..., $h_{i,-1}$, $h_{i,0}$, $h_{i,1}$, ... (wherein if i=0, 1, 2, ..., N−1) sequentially in time series, the absolute delay quantity $\tau_0$ is set so that an absolute value of the coefficient $h_{i,0}$ becomes maximal and the coefficient squaring sums $\Sigma(h_{i,-1})^2$ and $\Sigma(h_{i,1})^2$ are substantially equal to each other in the case of considering the coefficients of N filters to be designed.

Next, from among the obtained coefficients, an AD characteristic table 36 as shown in FIG. 13 is produced by using the values indicated by the coefficient trains $h_{i,-1}$, $h_{i,0}$, and $h_{i,1}$.

This AD characteristic table 36, for example, associates $h_{i,-1}$ with a table position (i, −1), $h_{i,0}$ with a table position (i, 0), and $h_{i,1}$ with a table position (i, 1).

On the other hand, based on the difference $H_i^*(\omega)$ of the frequency characteristics calculated in accordance with formula (13) described previously, the equalizer coefficient table 37 calculates frequency characteristics $G_i^*(\omega)$ in accordance with the formula below.

$$G_i^*(\omega)=1/H_i^*(\omega) \quad (14)$$

wherein $H_i^*(\omega) \neq 0$

In addition, in the range that meets a sampling theorem, an equalizer (filter) having an impulse response equivalent to the frequency characteristics $G_i^*(\omega)$ is defined as an equalizer that corresponds to an i-th analog-to-digital converter. A filter coefficient required for that equalizer is obtained. And the obtained filter coefficient is provided in advance in the equalizer coefficient table 37.

However, at the time of designing the filter having the equivalent impulse response, after an absolute delay quantity $\tau 1$ (second) common to all of N filters to be designed is arbitrarily set, an individual filter design is made.

In the case where the obtained filter coefficient is expressed as ..., $g_{i,-1}$, $g_{i,0}$, $g_{i,1}$, ... sequentially in time series, the setting value of the absolute delay quantity $\tau 1$ (second) common to all the filters is arbitrarily provided. However, in designing the equalizer coefficient table 27, the absolute delay quantity $\tau 0$ is set so that an absolute value of the coefficient $h_{i,0}$ becomes maximal and the coefficient squaring sums $\Sigma(g_{i,-1})^2$ and $\Sigma(g_{i,1})^2$ are substantially equal to each other.

Next, from among the obtained coefficients, a minimum value M1 that meets $|g_{i,M1}|<\epsilon$ (wherein $\epsilon$ denotes a predetermined allowable error) is determined, and similarly, a maximum value M2 that meets $|g_{i,M2}|<\epsilon$ is determined. Then, the equalizer coefficient table 37 as shown in FIG. 14 is produced using coefficient trains $g_{i,M1}$, ... $g_{i,-1}$, $g_{i,0}$, $g_{i-1}$, ..., $g_{i,M2}$.

In this case, for example, $g_{i,M1}$ is associated with a table position (i, M1), $h_{i,M1+1}$ is associated with a table position (i, M1+1), and then, sequential association is made up to a table position (i, M2).

At this time, the offset value a0=1 described previously (different depend on absolute delay quantity of a circuit configured) is determined in accordance with time responses of the estimating device 31 and the equalizer 32 to be designed.

At the time of producing this equalizer coefficient table 37, correction is carried out by squaring a window function (for example, cosine tapered window) such that its high frequency side is reduced with respect to frequency characteristics of a phase error, whereby a quick convergent impose response is obtained.

In this manner, a required number of filter coefficients can be reduced, a configuration can be simplified, and an equalizing processing delay quantity can also be reduced.

Now, an operation of the above configured time-interleaved analog-to-digital converter 20 will be described with reference to FIG. 15 and FIG. 16.

Figure 15:
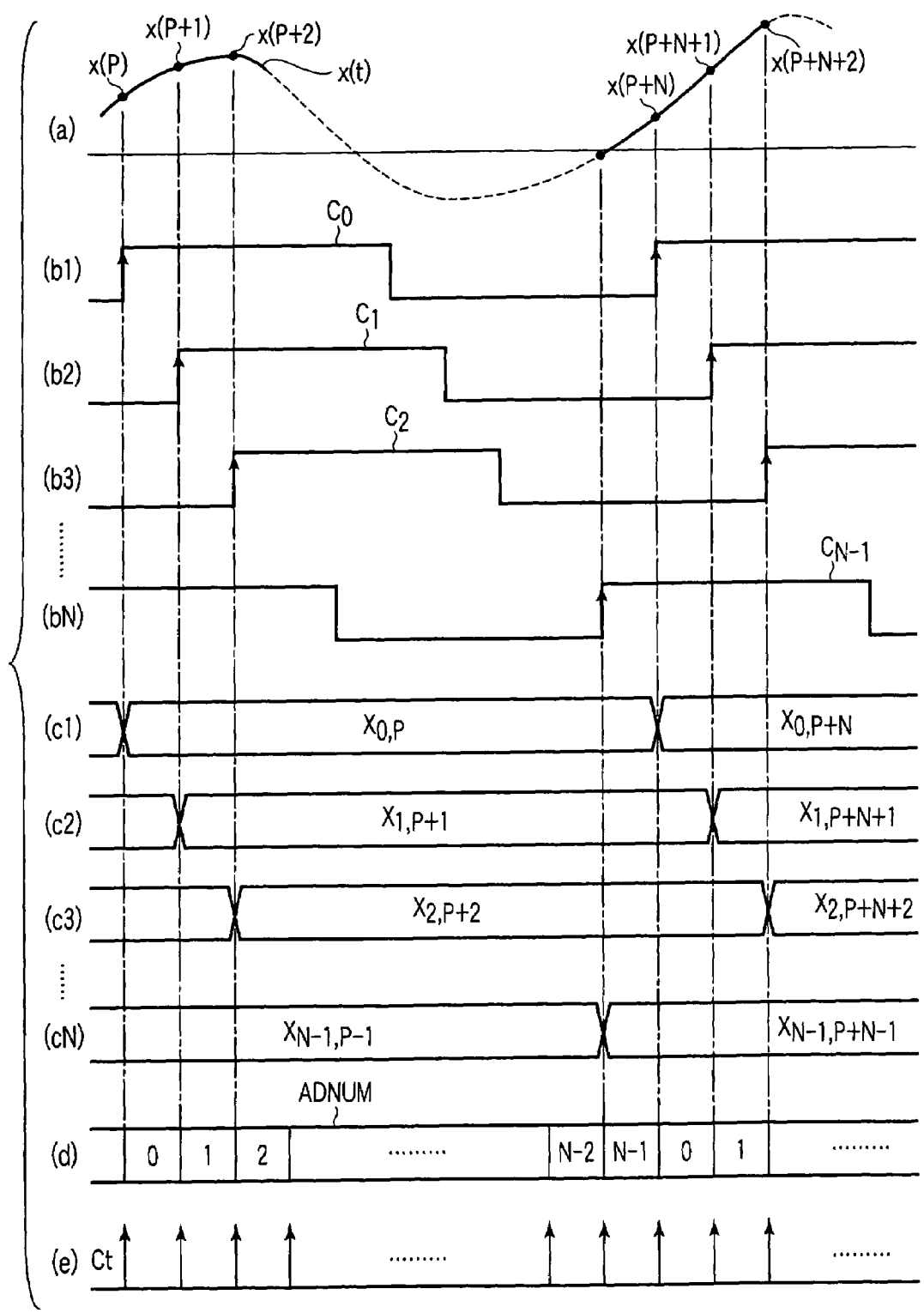
FIG. 15 is a timing chart showing an operation of the time-interleaved analog-to-digital converter shown in FIG. 1 for the purpose of explanation.

As shown in (a) of FIG. 15, a to-be-measured signal x(t) input to an input terminal 10a is input to a signal divider 11 via a switch 21, whereby the input signal is branched into N signal paths, and then, the divided signal components are input to analog-to-digital converters 12₀ to 12_{N-1}.

Each of the analog-to-digital converter 12₀ to 12_{N-1}, as shown in (b1) to (bN) of FIG. 15, receives each of the sampling clocks $C_0$ to $C_{12}$ output from a sampling control unit 13'. And then each of the analog-to-digital converter 12₀ to 12_{N-1} outputs, as shown in (c1) to (cN) of FIG. 15, the sample values $X_{0,P}$, $X_{1,P+1}$, ..., $X_{N-1,P+N-1}$ obtained by carrying out an analog-to-digital conversion processing relevant to each of the to-be-measured signal components $X_0(t)$ to $X_{N-1}(t)$ sequentially at a timing substantially shifted by a time Ts'.

Here, numerals are assigned sequentially in order of sampling timing. In a P-th sampling, an analog-to-digital converter 12₀ carries out an analog-to-digital conversion processing, and defines that the sample value has been updated. The thus updated sample value is represented as $X_{0,P}$.

At this time, a sampling control unit 13', as shown in (d) and (e) of FIG. 15, outputs a specifying signal ADNUM (for example, ADNUM=0) for specifying the analog-to-digital converter 12₀ whose sample value has been updated in accordance with an update timing of the analog-to-digital conversion result; and a timing signal Ct indicating a sampling timing relevant to an input signal.

In this state, other analog-to-digital converters $12_1$ to $12_{N-1}$ do not update the analog-to-digital conversion results, each of them updates the values as shown below, the values being held before carrying out the P-th sampling.

$$X_{1,P}=X_{1,P-1}$$

$$X_{2,P}=X_{2,P-1}$$

. . .

$$X_{N-1,P}=X_{N-1,P-1}$$

At the next P+1-th sampling timing, ADNUM=1 is obtained, and the sample value of the analog-to-digital converter $12_1$ is updated. Other analog-to-digital converters $12_0$, $12_2$ to $12_{N-1}$ output the same values when the P-th sampling timing is obtained.

Then, similarly, the conversion processings are sequentially made using the analog-to-digital converters $12_0$ to $12_{N-1}$. After the sample value of an N-1-th analog-to-digital converter $12_{N-1}$ has been updated, the above-described operation is cyclically repeated such that updating of the sample value is made using a 0-th analog-to-digital converter $12_0$ again.

Each of the estimating devices $31_0$ to $31_{N-1}$, as described previously, estimates a sample value obtained when it is assumed that an analog-to-digital converter whose sample value is not updated has made a sampling operation at that timing, by using the updated sample value.

Figure 16:
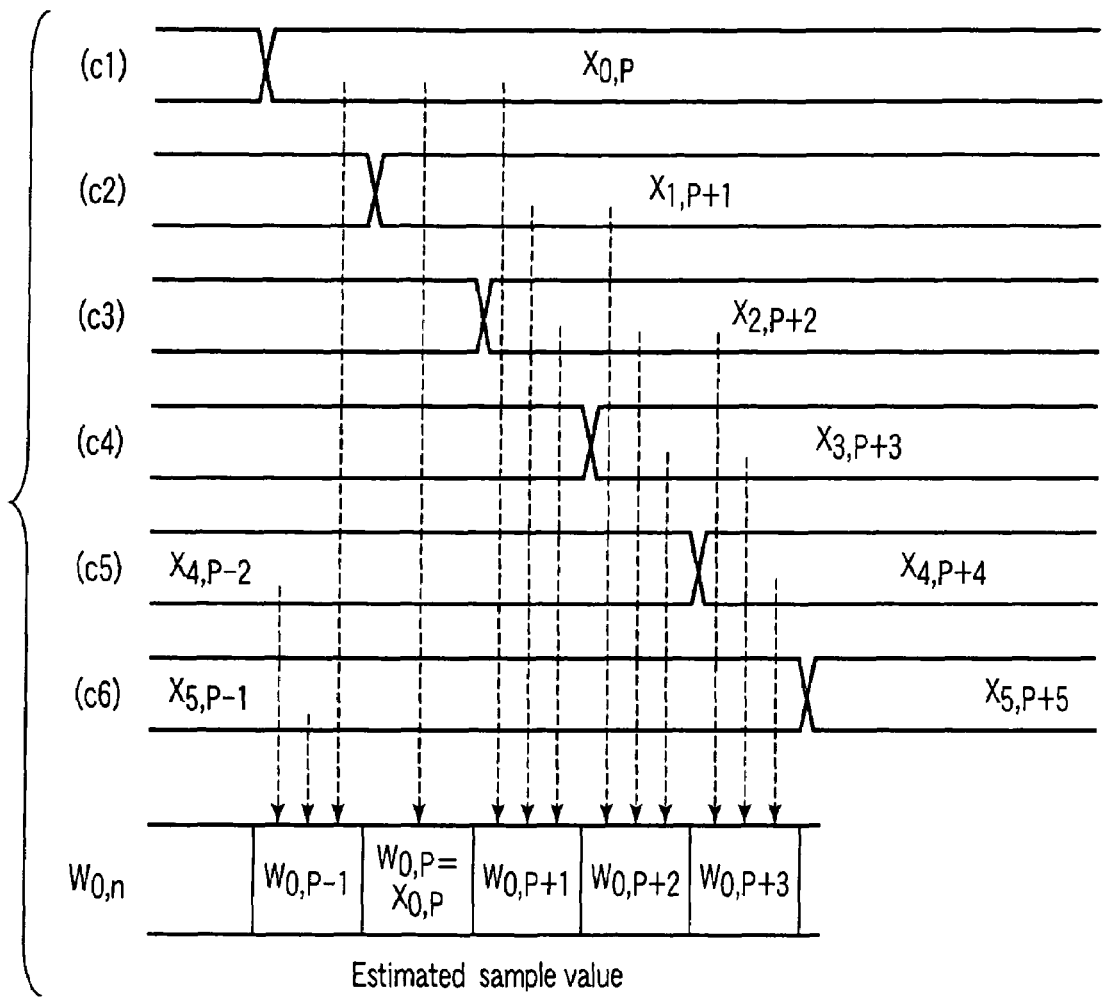
FIG. 16 is a timing chart showing an operation of the time-interleaved analog-to-digital converter shown in FIG. 1 for the purpose of explanation.

For example, in the case where N is equal to or greater than 3, in view of one estimating device $31_0$, as shown in FIG. 16, it becomes possible to estimate the P-th sample value at a sampling timing with respect to each of the analog-to-digital converters, the sampling timing immediately preceding a timing at which the P+1st sample value has been updated by the analog-to-digital converter $12_1$.

As a P-th estimated sample value $W_{0,P}$ of the estimating device $31_0$, the analog-to-digital converter $12_0$ already has a sample value $X_{0,P}$, and thus, this value is output as it is.

That is, this case corresponds to a case of i=b=0 in formula (12a) described previously.

In addition, the estimated sample value $W_{0,P+1}$ in the next P+2nd sampling timing is calculated in accordance with a computational formula showing in the case where i≠b in formula (12b) described previously, by using following values. Namely, a sample value $X_{2,P+2}$ of an analog-to-digital converter $12_2$ updated at that sampling timing, a sample value $X_{1,P+1}$ of an immediately preceding sampling timing, and a sample value $X_{0,P}$ of a further preceding sampling timing, and a coefficient of the AD characteristic table 36 are used.

Further, an estimated sample value $W_{0,P+2}$ at the next P+3rd sampling timing is calculated in accordance with a computational formula showing in the case where i≠b in formula (12b) described previously, by using following values. Namely, a sample value $X_{3,P+3}$ of an analog-to-digital converter $12_3$ updated at that sampling timing, a sample value $X_{2,P+2}$ of an immediately preceding sampling timing, and a sample value $X_{1,P+1}$ of a further preceding sampling timing, and a coefficient of the AD characteristic table 36 are used.

Then, a similar estimating processing is made, and sample trains $W_{0,P}, W_{0,P+1}, \ldots$ in which the estimated sample values are arranged in time series are output to an equalizer $32_0$.

With respect to other estimating devices $31_1$ to $31_{N-1}$ as well, a similar estimating processing is made, and the estimated sample values $W_{m,P}, W_{m,P+1}, \ldots$ (m=1, 2, …, N-1) are output to equalizers $32_1$ to $32_{N-1}$, respectively.

Each of the equalizers $32_1$ to $32_{N-1}$ carry out an equalizing processing (filtering) using a coefficient of the equalizer coefficient table 37 with respect to the estimated sample value W input, and then, output to a signal switching device 14' the sample values $y_{i,P}, y_{i,P+1}, \ldots$ (i=0, 1, …, N-1) whose errors have been corrected for the frequency characteristics with respect to a reference analog-to-digital converter.

The signal switching device 14' sequentially selects output the output values of an equalizer 32 that corresponds to an analog-to-digital converter specified by a specifying signal ADNUM at a timing shifted by the offset value a0 described previously, in response to a specifying signal ADNUM for specifying the analog-to-digital converter. Then, the signal switching device 14' outputs a digital signal sequence Y(n) in which the thus selected values are arranged in time series.

With respect to the thus obtained final analog-to-digital conversion result Y(n), the sample values actually obtained by the conversion processing of each analog-to-digital converter 12 and the sample trains made of the sample values estimated and calculated by each estimating device 31 are error-corrected by the equalizer 32, respectively, thus making it possible to remarkably reduce an effect of an error due to a difference in frequency characteristics between the analog-to-digital converters including a signal divider 11 or wiring and the like.

In addition, a filter coefficient used for a correction processing made of the estimating processing and equalizing processing is newly obtained and updated by the correction information calculating unit 41 at the time of input of a calibration signal, thereby making it possible to maintain a state in which an analog-to-digital conversion error is small.

In addition, from among the sample trains output by each equalizer 32, the sample value whose error is the smallest, obtained at the same sampling timing is selected by the signal switching device 14', thereby making it possible to significantly improve an analysis error caused by time waveform analysis or a frequency spectrum.

Now, a description will be given with respect to an example of analog-to-digital conversion characteristics of the above configured time-interleaved analog-to-digital converter 20.

Figure 17A:
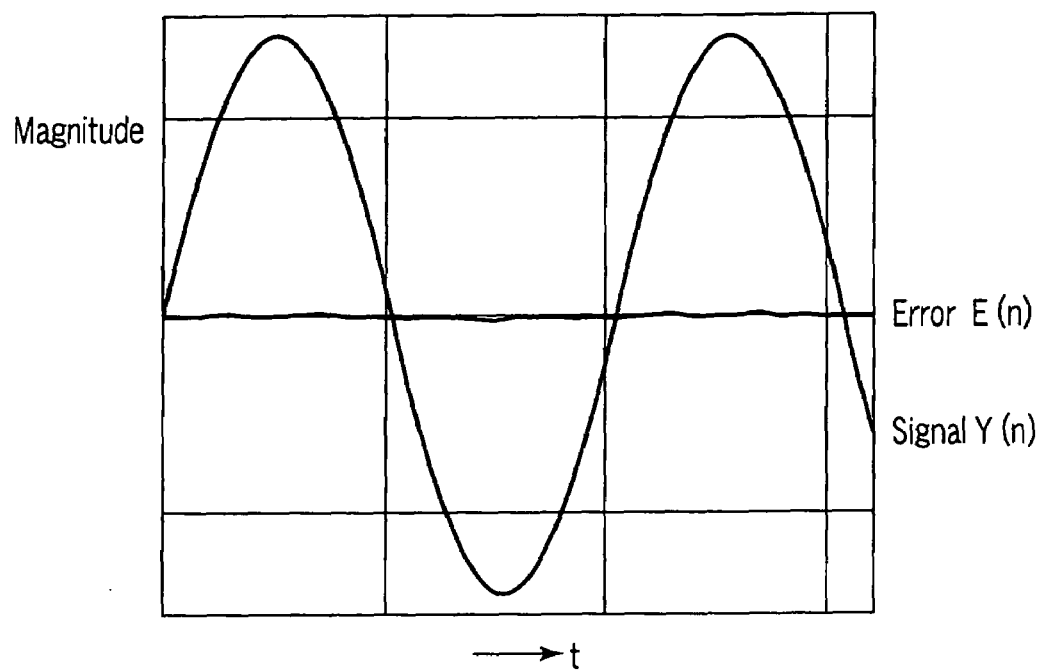
FIG. 17A is a characteristic view showing analog-to-digital conversion characteristics by the time-interleaved analog-to-digital converter shown in FIG. 1 for the purpose of explanation.
Figure 17B:
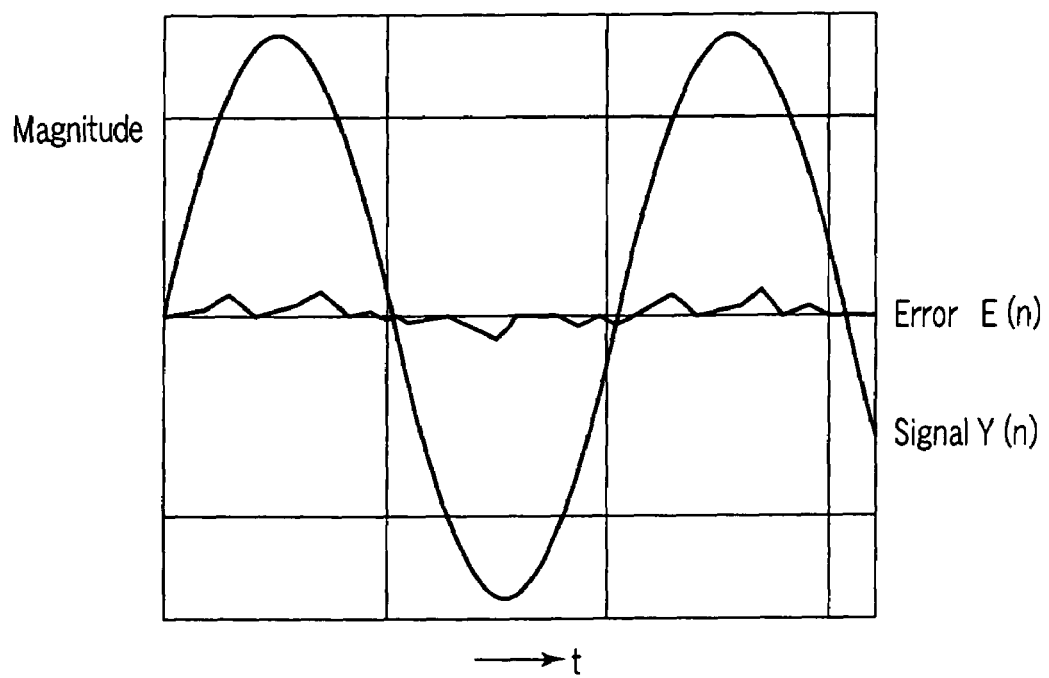
FIG. 17B is a characteristic view showing analog-to-digital conversion characteristics by a conventional time-interleaved analog-to-digital converter for the purpose of explanation.

FIG. 17A and FIG. 17B each show a time waveform of an error E(n) in response to a digital signal sequence Y(n) and an input signal obtained when a 10 MHz sine wave has been assigned as an input signal to the above-described time-interleaved analog-to-digital converter 20 according to the first embodiment and the conventional time-interleaved analog-to-digital converter 10 described previously.

With the time waveform of the time-interleaved analog-to-digital converter 20 according to the first embodiment shown in FIG. 17A, it is found that almost no error occurs as compared with the time waveform of the conventional time-interleaved analog-to-digital converter 10 shown in FIG. 17B.

Figure 18A:
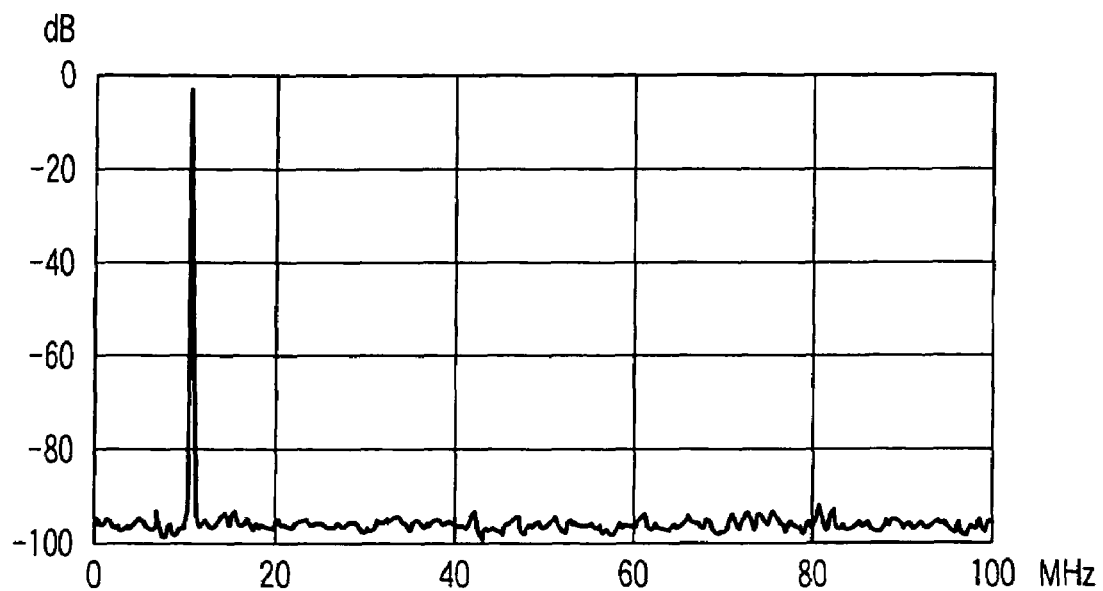
FIG. 18A is a characteristic view showing analog-to-digital conversion characteristics by the time-interleaved analog-to-digital converter shown in FIG. 1 for the purpose of explanation.
Figure 18B:
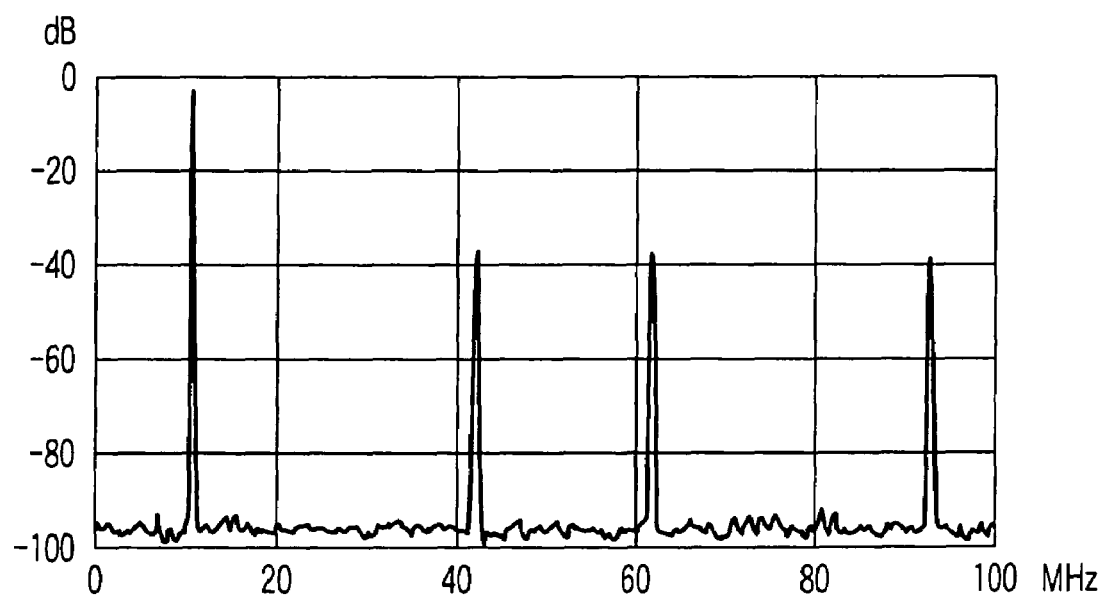
FIG. 18B is a characteristic view showing analog-to-digital conversion characteristics by a conventional time-interleaved analog-to-digital converter for the purpose of explanation.

In addition, FIGS. 18A and 18B each show a frequency spectrum waveform obtained by carrying out FFT analysis with respect to the digital signal sequence Y(n) output by each of the time-interleaved analog-to-digital converter 20 according to the first embodiment and the conventional time-interleaved analog-to-digital converter 10 described above, when a sine wave having a frequency of 10 MHZ has been defined as an input signal.

In the spectrum waveform of the conventional time-interleaved analog-to-digital converter 10 shown in FIG. 18B, a large spurious component (about −40 dB with respect to a basic wave) in the vicinity of frequencies of about 41, 61, and 93 MHz other than 10 MHz of the basic wave is generated.

In contrast, in the spectrum waveform of the time-interleaved analog-to-digital converter 20 according to the first embodiment shown in FIG. 18A, a spurious component other than 10 MHz of the basic wave is not monitored.

Figure 19B:
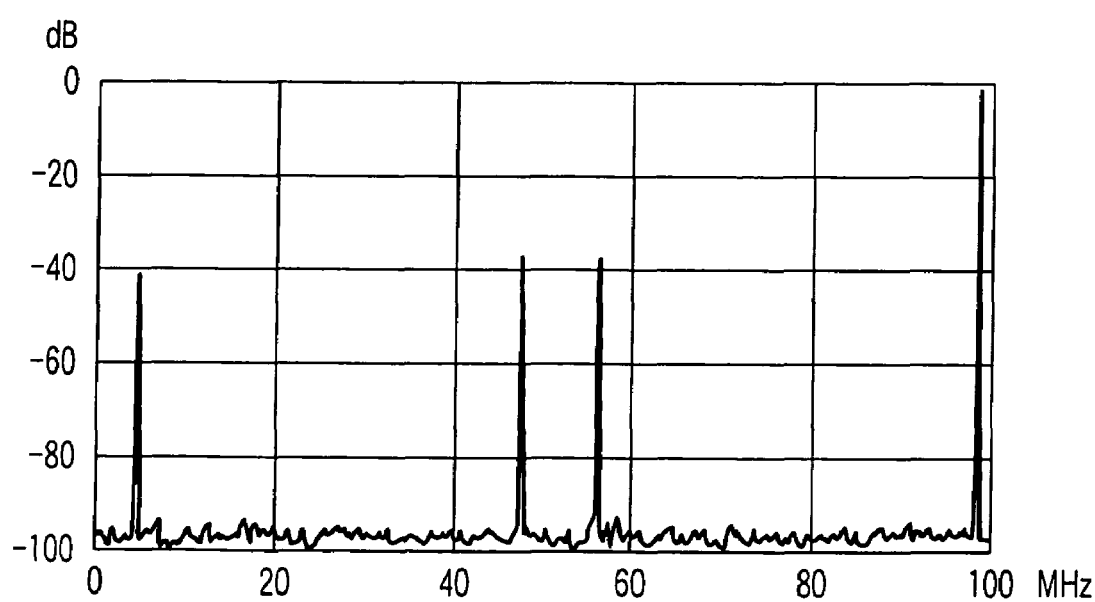
FIG. 19B is a characteristic view showing analog-to-digital conversion characteristics by the time-interleaved analog-to-digital converter shown in FIG. 1 for the purpose of explanation.

In addition, FIGS. 19A and 19B each show a frequency spectrum waveform obtained by carrying out FFT analysis with respect to the digital signal sequence Y(n) output by each of the above-described time-interleaved analog-to-digital converter 20 according to the first embodiment and the conventional time-interleaved analog-to-digital converter 10 described previously, when a sine wave having a frequency of 98 MHz has been defined as an input signal.

In the spectrum waveform of the conventional time-interleaved analog-to-digital converter 10 shown in FIG. 19B, a large spurious component (about −40 dB with respect to a basic wave) in the vicinity of frequencies of about 4, 47, and 56 MHz other than a 98 MHz basic wave is generated.

In contrast, in the spectrum waveform of the time-interleaved analog-to-digital converter 20 according to the first embodiment shown in FIG. 19A, only a spurious component (about −85 dB with respect to a basic wave) that is slightly greater than a noise level is merely monitored in the vicinity of the frequencies of about 4, 47, and 56 MHz other than 98 MHz of the basic wave.

In this manner, in the time-interleaved analog-to-digital converter 20 according to the first embodiment, it is found that, in the correction processing unit 30, the digital signal sequence obtained by carrying out the above-described estimating processing and equalizing processing is remarkably reduced in error difference that causes an error of a time waveform or a spurious component of a frequency spectrum.

In addition, in the time-interleaved analog-to-digital converter 20 according to the first embodiment, the information required for this correction processing can be acquired within a short period of time, as described previously, thus making it possible to carry out an analog-to-digital conversion processing in a state extremely high precision has been maintained.

In addition, in the above-described time-interleaved analog-to-digital converter 20 according to the first embodiment, it is verified that an occurrence of a spurious component can be improved by about 30 dB as compared with the conventional time-interleaved analog-to-digital converter 10.

As in the above-described embodiment, instead of estimating a sample value from three analog-to-digital conversion results, a sample value may be estimated from one analog-to-digital conversion result updated at a sampling timing of a sample value that requires estimation.

In this case, in the first term of formula (12b) described previously, it becomes possible to make estimation by using only a computational formula wherein b=a, and a calculating processing for estimation can be made at a high speed.

In addition, in this case as well, it is verified that an occurrence of a spurious component can be improved by about 40 dB as compared with the conventional time-interleaved analog-to-digital converter 10.

In addition, when N=2, in the case where estimation is made using three sample values in order for two analog-to-digital converters 12$_0$ and 12$_1$ to alternately carry out an analog-to-digital conversion processing, a sample value $X_{i, P-1}$ before updated, of the analog-to-digital converter 12$_1$, is stored in a memory (not shown) of an estimating device 31$_1$ that corresponds thereto. Then, when a sample value $X_{1, P+1}$ after updated, of the analog-to-digital converter 12$_1$ has been successfully obtained, a sample value $W_{1, P}$ of an intermediate timing of the sample values $X_{1, P-1}$ and $X_{1, P+1}$ may be estimated and calculated from these two sample values $X_{1, P-1}$ and $X_{1, P+1}$ and a sample value $X_{0, P}$ of the other analog-to-digital converter 12$_0$.

This also applies to the other analog-to-digital converter 12$_0$.

Even if another correction processing is used instead of an example of the correction processing and correction information applied to the time-interleaved analog-to-digital converter 20 according to the present embodiment described above, the time-interleaved analog-to-digital converter according to the present invention can be applied similarly.

Second Embodiment

FIG. 20 is a block diagram depicting a configuration of essential portions of a time-interleaved analog-to-digital converter according to a second embodiment of the present invention for the purpose of explanation.

In the time-interleaved analog-to-digital converter 20 according to the first embodiment described previously, an estimating device 31 is designed to estimate and output a sample value based on a sample value of another analog-to-digital converter and a coefficient of an AD characteristic table 36 when a corresponding analog-to-digital converter itself does not make a sampling operation.

Instead, as shown in FIG. 20, an equalizer 32 and a signal switching device 14' are eliminated, and then, the sample value of each analog-to-digital converter 12 is input to an only estimating device, thereby making it possible to output from an output terminal 10b an estimated sample value W output by the estimating device 31 as a final analog-to-digital conversion result Y(n) as it is.

In this manner, the configuration of the time-interleaved analog-to-digital converter 20 can be simplified remarkably.

Third Embodiment

FIG. 21 is a block diagram depicting a configuration of essential portions of a time-interleaved analog-to-digital converter according to a third embodiment of the present invention for the purpose of explanation.

That is, in the time-interleaved analog-to-digital converter 20 according to the third embodiment of the present invention, as shown in FIG. 21, a nonlinear type error can be reduced by providing phase adjusting means 51$_0$ to 51$_{N-1}$ (such as a line stretcher, for example) for adjusting a phase of clocks $C_0$ to $C_{N-1}$ input to analog-to-digital converters 12$_0$ to 12$_{N-1}$, and then, setting the phase of clock signals at an ideal value at an upper limit (Fs'/2) of a sampling frequency.

Then, phase adjustment is thus made, whereby, as described previously, even if a sample value is estimated from one sample value obtained by an analog-to-digital conversion processing, an analog-to-digital conversion error can be reduced.

In addition, in this manner, a sampling timing error of the sampling is reduced, whereby a tap length (the sizes of M2 and M2 described previously) of the equalizer 32 can be reduced, thus making it possible to simply configure the equalizer 32 itself.

Fourth Embodiment

FIG. 22 is a block diagram depicting a configuration of essential portions of a time-interleaved analog-to-digital converter according to a fourth embodiment of the present invention for the purpose of explanation.

A signal divider 11 of the time-interleaved analog-to-digital converter 20 according to the first embodiment is designed to output to analog-to-digital converter $12_0$ to $12_{N-1}$ a to-be-measured signal to be input. Thus, electric power of the to-be-measured signal to be input is input to each of the analog-to-digital converters $12_0$ to $12_{N-1}$ on a 1/N by 1/N basis. In the case where N is excessively large, the input level range of the analog-to-digital converter cannot be efficiently used.

If a configuration is provided to employ a signal using an amplifier in order to improve this problem, a distortion in characteristics of that amplifier is added as an error factor of an interleave scheme time-interleaved analog-to-digital converter. Thus, a correction processing becomes complicated and analog-to-digital conversion precision is lowered.

In such a case, as in the signal divider 11 shown in FIG. 22, a signal divider is composed of a switch circuit 11a that selectively outputs a to-be-measured signal to analog-to-digital converters $12_0$ to $12_{N-1}$, and a switch circuit 11b that sequentially switches the switch circuit 11a every time sampling clocks $C_0$ to $C_{N-1}$ are received. Then, from among the analog-to-digital converters $12_0$ to $12_{N-1}$, the to-be-measured signal may be selectively assigned to only an analog-to-digital converter 12 that makes a sampling operation.

With such a configuration, the to-be-measured signal can be assigned to each of the analog-to-digital converters $12_0$ to $12_{N-1}$ with a low loss, without a need for using an amplifier that causes an error, thus making it possible to efficiently utilize the input level range of the analog-to-digital converter and to improve analog-to-digital conversion precision.

Fifth Embodiment

Figure 10A:
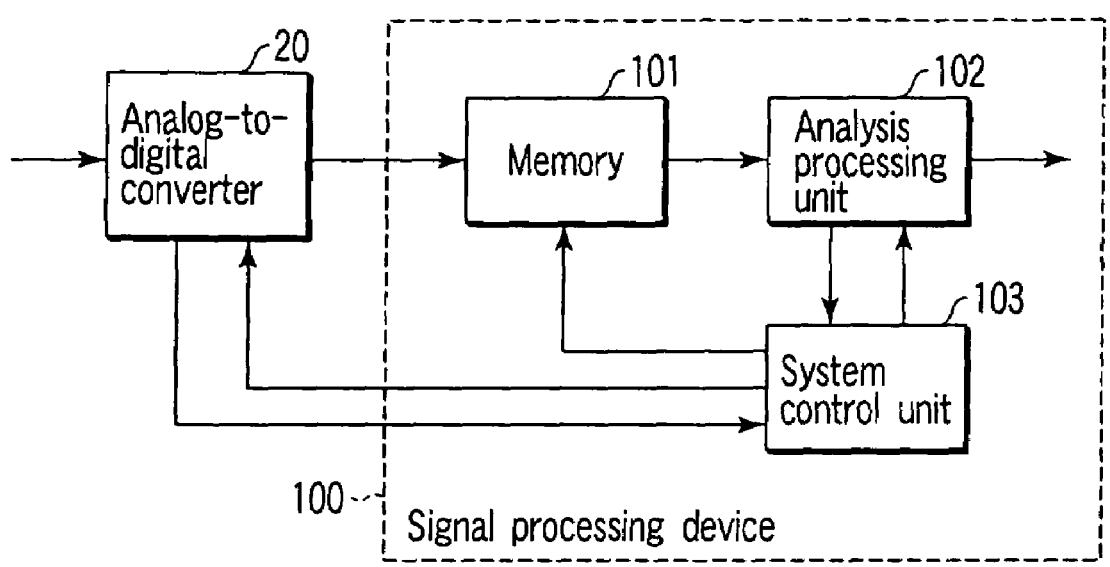
FIG. 10A is a block diagram depicting a conceptual configuration of a high speed signal processing system according to a fifth embodiment of the present invention for the purpose of explanation.

FIG. 10A is a block diagram depicting a conceptual configuration of a high speed signal processing system according to a fifth embodiment of the present invention for the purpose of explanation.

In this case, the high speed signal processing system is composed of a time-interleaved analog-to-digital converter 20 shown in FIG. 11, and a signal processing device 100 capable of executing a variety of signal processings such as spectrum analysis, for example, in response to an analog-to-digital converted output signal from this time-interleaved analog-to-digital converter 20.

That is, in this high speed signal processing system according to the fifth embodiment, the signal processing device 100 comprises a memory 101 that stores an analog-to-digital conversed output signal from a time-interleaved analog-to-digital converter 20 shown in FIG. 1, an analysis processing unit 102 that carries out a predetermined signal analysis processing with respect to the analog-to-digital converted output signal stored in the memory 101, and a system control unit 103. The system control unit 103 makes a control for the time-interleaved analog-to-digital converter 20 to carry out analog-to-digital conversion for a calibration processing, followed by calculation and updating of the correction information, while a calibration processing request is assigned to a control unit 40 of the time-interleaved analog-to-digital converter 20 in a period in which the signal processing device 100 carries out the predetermined signal analysis processing, and a control for causing the time-interleaved analog-to-digital converter 20 to set the to-be-measured signal so as to be analog-to-digital convertible to receive the end of the update processing of the correction information from the time-interleaved analog-to-digital converter 20.

FIG. 10B is a block diagram depicting a processing relationship between a signal processing device 100 and a time-interleaved analog-to-digital converter 20 of the high speed signal processing system shown in FIG. 10A for the purpose of explanation.

In this case, the signal processing device 100, for example, as shown in (a) of FIG. 10B, assumes a batch processing system for repeating an operation of storing a digital signal sequence Y(n) obtained by carrying out an analog-to-digital conversion processing for a predetermined period of time in response to a to-be-measured signal x(t) using a time-interleaved analog-to-digital converter 20, in a memory 101 incorporated in the signal processing 100, and then, of carrying out an analysis processing or the like in response to that digital signal sequence Y(n).

In addition, in this high speed signal processing system, as shown in (a) and (b) of FIG. 10B, while the signal processing device 100 carries out an analysis processing, a calibration signal is input to a time-interleaved analog-to-digital converter 20, thereby making it possible to obtain and update correction information required for correction. Thus, for example, even in the case where this signal processing system is used in an environment such that an ambient temperature changes with an elapse of time, the system performance can be maintained with high precision.

Analysis in a frequency bandwidth wider than that of the time-interleaved analog-to-digital converter 20 can be achieved by further providing a down converter (not shown) that includes a local oscillator and a mixer.

Therefore, as described above in detail, according to the present invention, there can be provided a time-interleaved analog-to-digital converter and a high speed signal processing system using the device. The time-interleaved analog-to-digital converter solves the problems with the prior art as described above, and is improved so that data required for correction can be acquired within a short period of time.

The invention claimed is:

1. A time-interleaved analog-to-digital converter comprising:

an input terminal to input a to-be-measured signal;
a signal generator which generates a calibration signal;
a plurality of N analog-to-digital converters;
a switch which selects one of the to-be-measured signal input from the input terminal and the calibration signal output from the signal generator;
a signal divider which divides the signal selected by the switch into a plurality of N components, and causes the plurality of N analog-to-digital converters to input the divided signal components, respectively;
a sampling control unit which assigns sampling clocks whose cycle is Ts and whose phase is shifted by Ts/N, respectively, to the plurality of N analog-to-digital converters;
a correction information memory which stores correction information required to correct an error between signals output by the plurality of N analog-to-digital converters, the error occurring when a difference exists in at least one of a frequency characteristic of an amplitude and a frequency characteristic of a phase from input to the input terminal to a conversion processing in the plurality of N analog-to-digital converters;
a correction processing unit which carries out a correction processing in accordance with the correction information stored in the correction information memory in response to signals output by the plurality of N analog-to-digital converters to receive the to-be-measured signal; and
a correction information calculating unit which calculates an amplitude and a phase of the plurality of signal components by carrying out a spectrum analysis with respect to signals output by the plurality of N analog-to-digital converters to receive the calibration signal output from the signal generator, newly obtains the correction information based on a result of the calculation, and updates contents of the correction information memory in accordance with newly obtained correction information, wherein the signal generator is configured to generate the calibration signal to include a plurality of signal components positioned, respectively, at desired frequencies in a bandwidth in which N/2 times of a frequency Fs of the sampling clock assigned to each of the plurality of analog-to-digital converters is defined as an upper limit, the plurality of signal components appearing at frequencies different from each other in a bandwidth in which half of the frequency Fs of the sample clock is defined as an upper limit by sampling of each of the analog-to-digital converters.

2. The time-interleaved analog-to-digital converter according to claim 1, wherein the signal generator outputs as the calibration signal a pulse signal of which the plurality of signal components in the bandwidth in which N/2 times of the frequency Fs of the sampling clock is defined as the upper limit includes a basic wave component and a high harmonic wave component of up to a predetermined order, the pulse signal having a power ratio between overlapped components of a predetermined value or smaller, in the case where a high harmonic wave component that is higher in order than the predetermined order from high harmonic wave components of the pulse signal and the plurality of signal components overlap in a same frequency in the bandwidth in which half of the frequency Fs of the sampling clock is defined as the upper limit by sampling of each of the analog-to-digital converters.

3. The time-interleaved analog-to-digital converter according to claim 1, wherein the signal generator comprises:
a plurality of sine wave generators which generate sine wave signals in the bandwidth in which N/2 times of the frequency Fs of the sample clock is defined as the upper limit, the sine wave signals having different frequencies from each other; and
an additive combiner which additively combines output signals of the plurality of sine wave generators with each other.

4. The time-interleaved analog-to-digital converter according to claim 1, wherein the correction information calculating unit uses one of the plurality of N analog-to-digital converters as a reference analog-to-digital converter based on the amplitude and phase of the plurality of signal components obtained by the spectrum analysis, and is configured to calculate as the correction information a coefficient of a filter having an impulse response that meets a characteristic of a difference between a frequency characteristic from the input terminal to each of output terminals of the plurality of N analog-to-digital converters and a frequency characteristic of the reference analog-to-digital converter, and to store the calculated coefficient in an AD characteristic table in the correction information memory, and the correction processing unit includes an estimating device which estimates a sample value obtained assuming that another analog-to-digital converter has made a conversion processing at a timing of updating a sample value by an analog-to-digital converter having received the sampling clock based on each of the sample values output from the plurality of N analog-to-digital converters in response to the to-be-measured signal and the coefficient stored in the AD characteristic table.

5. The time-interleaved analog-to-digital converter according to claim 4, wherein the correction information calculating unit is configured to calculate as the correction information a coefficient of a filter having an impulse response that meets a frequency characteristic of offsetting a difference between a frequency characteristic of the reference analog-to-digital converter and a frequency characteristic of remainders of the plurality of N analog-to-digital converters, respectively, based on the amplitude and phase of the plurality of signal components obtained by the spectrum analysis, and to store the calculated coefficient in an equalizer coefficient table in the correction information memory, and the correction processing unit includes a plurality of estimating devices, each of which is provided as the estimating device at each of the analog-to-digital converters;

and a plurality of equalizers, each of which carries out filtering based on the coefficient stored in the equalizer coefficient table with respect to each of the sample values output by the plurality of estimating devices, and outputs an error-corrected sample value.

6. The time-interleaved analog-to-digital converter according to claim 1, by further comprising:
a plurality of attenuators interposed at least any one of between the input terminal and the switch, between the signal generator and the switch, and between the signal divider and the switch.

7. The time-interleaved analog-to-digital converter according to claim 6, further comprising:
a second switch interlocked with the switch; and
a terminator connected to the second switch,
wherein the analog-to-digital converter is configured to, when the calibration signal is selected by the switch, close the second switch and enable the terminator to terminate the to-be-measured signal input from the input terminal.

8. The time-interleaved analog-to-digital converter according to claim 1, further comprising:
signal combining means configured to combine output signals, which are output by the plurality of N analog-to-digital converters to receive the to-be-measured signal through sampling based on the sampling clock, in digital signal sequences arranged in order of sampling, and to output combined output signals.

9. The time-interleaved analog-to-digital converter according to claim 8, wherein the signal combining means comprises:
an output terminal to output the digital signal sequence; and
a signal switching device which sequentially selectively switches output signals, that are output by the plurality of N analog-to-digital converters to receive the to-be-measured signal through sampling based on the sampling clock, respectively, and which outputs the output signals to the output terminal,
wherein, in order to sequentially selectively switch and output the output signals, that are output by the plurality of N analog-to-digital converters, by means of the signal switching device, the sampling control unit assigns to the signal switching device a specifying signal that specifies an analog-to-digital converter having carried out sampling from among the plurality of N analog-to-digital converters, thereby making it possible to combine signals in digital signal sequences arranged from the signal switching device in order of sampling, and to output combined output signals to the output terminal.

10. The time-interleaved analog-to-digital converter according to claim 9, further comprising:
a control unit to connect the switch to the signal generator side and input the calibration signal to the signal divider in response to a calibration processing request in accordance with an external instruction or a predetermined time schedule.

11. A signal processing system comprising:
a time-interleaved analog-to-digital converter; and
a signal processing device which executes a predetermined signal processing in response to an analog-to-digital converted output signal from the time-interleaved analog-to-digital converter,
the time-interleaved analog-to-digital converter comprising:
an input terminal to input a to-be-measured signal;
a signal generator which generates a calibration signal;
a plurality of N analog-to-digital converters;
a switch which selects one of the to-be-measured signal input from the input terminal and the calibration signal output from the signal generator;
a signal divider which divides the signal selected by the switch into a plurality of N components, and causes the plurality of N analog-to-digital converters to input the divided signal components, respectively;
a sampling control unit which assigns sampling clocks whose cycle is Ts and whose phase is shifted by Ts/N, respectively, to the plurality of N analog-to-digital converters;
a correction information memory which stores correction information required to correct an error between signals output by the plurality of N analog-to-digital converters, the error occurring when a difference exists in at least one of a frequency characteristic of an amplitude and a frequency characteristic of a phase from input to the input terminal to a conversion processing in the plurality of N analog-to-digital converters;
a correction processing unit which carries out a correction processing in accordance with the correction information stored in the correction information memory in response to signals output by the plurality of N analog-to-digital converters to receive the to-be-measured signal; and
a correction information calculating unit which calculates an amplitude and a phase of the plurality of signal components by carrying out a spectrum analysis with respect to signals output by the plurality of N analog-to-digital converters to receive the calibration signal output from the signal generator, newly obtains the correction information based on a result of calculation, and updates contents of the correction information memory in accordance with newly obtained correction information,
wherein the signal generator is configured to generate the calibration signal to include a plurality of signal components positioned, respectively, at desired frequencies in a bandwidth in which N/2 times of a frequency Fs of the sampling clock assigned to each of the plurality of analog-to-digital converters is defined as an upper limit, the plurality of signal components appearing at frequencies different from each other in a bandwidth in which half of the frequency Fs of the sample clock is defined as an upper limit by sampling of each of the analog-to-digital converters.

12. The high speed signal processing system according to claim 11, wherein the signal generator of the time-interleaved analog-to-digital converter outputs as the calibration signal a pulse signal of which the plurality of signal components in the bandwidth in which N/2 times of the frequency Fs of the sampling clock is defined as the upper limit includes a basic wave component and a high harmonic wave component of up to a predetermined order, the pulse signal having a power ratio between overlapped frequencies a predetermined value or smaller in the case where a high harmonic wave component that is higher in order than the predetermined order from high harmonic wave components of the pulse signal and the plurality of signal components overlap in a same frequency in the bandwidth in which half of the frequency Fs of the sampling clock is defined as the upper limit by sampling of each of the analog-to-digital converters.

13. The high speed signal processing system according to claim 11, wherein the signal generator of the time-interleaved analog-to-digital converter comprises:
a plurality of sine wave generators which generate sine wave signals in the bandwidth in which N/2 times of the frequency Fs of the sample clock is defined as the upper limit and at different frequencies from each other; and
an additive combiner which additively combines output signals of the plurality of sine wave generators with each other.

14. The high speed signal processing system according to claim 11, wherein the correction information calculating unit of the time interleave scheme analog-to-digital converter uses one of the plurality of N analog-to-digital converters as a reference analog-to-digital converter based on the amplitude and phase of the plurality of signal components obtained by the spectrum analysis, and is configured to calculate as the correction information a coefficient of a filter having an impulse response that meets a characteristic of a difference between a frequency characteristic from the input terminal to each of output terminals of the plurality of N analog-to-digital converters and a frequency characteristic of the reference analog-to-digital converter, and to store calculated coefficient in an AD characteristic table in the correction information memory, and
the correction processing unit of the analog-to-digital converter includes an estimating device which estimates a sample value obtained assuming that another analog-to-digital converter has made a conversion processing at a timing of updating a sample value by an analog-to-digital converter having received the sampling clock based on each of the sample values output from a plurality of N analog-to-digital converters in response to the to-be-measured signal and the coefficient stored in the AD characteristic table.

15. The high speed signal processing system according to claim 14, wherein the correction information calculating unit of the time-interleaved analog-to-digital converter is configured to calculate as the correction information a coefficient of a filter having an impulse response that meets a frequency characteristic of offsetting a difference between a frequency characteristic of the reference analog-to-digital converter and a frequency characteristic of the remainders of the plurality of N analog-to-digital converters, respectively, based on the amplitude and phase of the plurality of signal components obtained by the spectrum analysis, and to store calculated coefficient in an equalizer coefficient table in the correction information memory, and
the correction processing unit of the time-interleaved analog-to-digital converter includes:
a plurality of estimating devices, each of which is provided as the estimating device at each of the analog-to-digital converters; and
a plurality of equalizers, each of which carries out filtering based on the coefficient stored in the equalizer coefficient table with respect to each of sample values output by the plurality of estimating devices, and outputs an error-corrected sample value.

16. The high speed signal processing system according to claim 11, wherein the time-interleaved analog-to-digital converter further comprises:
a plurality of attenuators interposed at least any one of between the input terminal and the switch, between the signal generator and the switch, and between the signal divider and the switch.

17. The high speed signal processing system according to claim 16, wherein the time-interleaved analog-to-digital converter further comprises:
a second switch interlocked with the switch; and
a terminator connected to the second switch, and
the analog-to-digital converter is configured to, when the calibration signal is selected by the switch, close the second switch and enable the terminator to terminate the to-be-measured signal input from the input terminal.

18. The high speed signal processing system according to claim 11, wherein the time-interleaved analog-to-digital converter further comprises:
signal combining means configured to combine output signals, which are output by the plurality of N analog-to-digital converters to receive the to-be-measured signal through sampling based on the sampling clock, in digital signal sequences arranged in order of sampling, and to output combined output signals.

19. The high speed signal processing system according to claim 18, wherein the signal combining means of the time-interleaved analog-to-digital converter comprises:
an output terminal to output the digital signal sequence; and
a signal switching device which sequentially selectively switches output signals, that are output by the plurality of N analog-to-digital converters to receive the to-be-measured signal through sampling based on the sampling clock, and which outputs each of the output signals to the output terminal,
wherein, in order to sequentially selectively switch and output each of the output signals, that are output by the plurality of N analog-to-digital converters, by means of the signal switching device, the sampling control unit of the time-interleaved analog-to-digital converter assigns to the signal switching device a specifying signal that specifies an analog-to-digital converter having carried out sampling from among the plurality of N analog-to-digital converters, thereby making it possible to combine signals in digital signal sequences arranged from the output signal switching device in order of sampling, and to output combined output signals to the output terminal.

20. The high speed signal processing system according to claim 19, wherein the time-interleaved analog-to-digital converter further comprises:
a control unit to connect the switch to a side of the signal generator and input the calibration signal to the signal divider in response to a calibration processing request in accordance with an external instruction or a predetermined time schedule.

21. The high speed signal processing system according to claim 11, wherein the signal processing device comprises:
a memory which stores analog-to-digital converted output signal output from the time-interleaved analog-to-digital converter;
an analysis processing unit which carries out a predetermined signal analysis processing with respect to the analog-to-digital converted output signal stored in the memory; and
a system control unit which assigns a calibration processing request to the analog-to-digital converter during a period in which the signal processing device carries out the predetermined signal analysis processing, and causes the analog-to-digital converter to carry out analog-to-digital conversion for the calibration processing, followed by calculation and updating of the correction information and which sets the to-be-measured signal so as to be analog-to-digital convertible with respect to the analog-to-digital converter to receive an end of updating the correction information from the analog-to-digital converter.

* * * * *